US012713819B2

(12) United States Patent
Hwang et al.

(10) Patent No.: US 12,713,819 B2
(45) Date of Patent: Aug. 18, 2026

(54) EMISSIVE DISPLAY DEVICE INCLUDING A SCATTERING LAYER

(71) Applicant: SAMSUNG DISPLAY CO., LTD., Yongin-si (KR)

(72) Inventors: Seong-Yong Hwang, Yongin-si (KR); Hyun Duck Cho, Yongin-si (KR); Kook Hyun Choi, Yongin-si (KR); Jun Hee Lee, Yongin-si (KR); Ji Hwang Lee, Yongin-si (KR); Choong Youl Im, Yongin-si (KR); Beohm Rock Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 421 days.

(21) Appl. No.: 18/482,734

(22) Filed: Oct. 6, 2023

(65) Prior Publication Data

US 2024/0215413 A1 Jun. 27, 2024

(30) Foreign Application Priority Data

Dec. 27, 2022 (KR) ........................ 10-2022-0186131

(51) Int. Cl.
*H10K 50/854* (2023.01)
*H10K 59/122* (2023.01)
*H10K 59/80* (2023.01)

(52) U.S. Cl.
CPC ....... *H10K 59/8791* (2023.02); *H10K 59/122* (2023.02)

(58) Field of Classification Search
CPC ............. H10K 59/8791; H10K 59/122; H10K 59/877; H10K 50/854
USPC .................................................. 313/498–512
See application file for complete search history.

(56) References Cited

U.S. PATENT DOCUMENTS

2004/0228141 A1* 11/2004 Hay ........................ G02B 5/045 362/555
2010/0187987 A1* 7/2010 Nakamura ........... H10K 50/854 313/504
2013/0264555 A1* 10/2013 Ishibashi .............. G02B 5/0231 257/40

(Continued)

FOREIGN PATENT DOCUMENTS

KR 10-1086551 11/2011
KR 10-1768149 8/2017

(Continued)

*Primary Examiner* — Christopher M Raabe
(74) *Attorney, Agent, or Firm* — F. CHAU & ASSOCIATES, LLC

(57) ABSTRACT

An emissive display device includes a substrate. A first electrode is disposed on the substrate. A pixel defining layer has a first opening exposing the first electrode. A second electrode is disposed on both the pixel defining layer and the first electrode. An encapsulation layer at least partially covers the second electrode. A light blocking layer is disposed on the encapsulation layer and has a second opening. A color filter is disposed on the light blocking layer. A scattering layer is disposed within the second opening of the light blocking layer and includes a plurality of scattering particles. Particle density of the scattering particles has a value of 1 ea/mm$^3$ or more and 10 ea/mm$^3$ or less, and a diameter of the scattering particles is 0.1 μm or more and 1.5 μm or less.

20 Claims, 33 Drawing Sheets

(56) References Cited

U.S. PATENT DOCUMENTS

| | | | | |
|---|---|---|---|---|
| 2015/0211722 | A1* | 7/2015 | Guimard | H10K 50/816 432/24 |
| 2016/0020416 | A1* | 1/2016 | Guimard | H10K 50/814 216/17 |
| 2016/0195773 | A1* | 7/2016 | Lee | G02F 1/133617 349/110 |
| 2017/0207401 | A1* | 7/2017 | Guimard | H10K 59/80522 |
| 2019/0067644 | A1* | 2/2019 | Choi | H10K 59/8731 |
| 2020/0168677 | A1* | 5/2020 | Gao | H10K 59/877 |
| 2022/0028849 | A1* | 1/2022 | Huang | G06V 40/1318 |

FOREIGN PATENT DOCUMENTS

| | | |
|---|---|---|
| KR | 10-2018-0025535 | 3/2018 |
| KR | 10-2019-0023758 | 3/2019 |
| KR | 10-2159160 | 9/2020 |
| KR | 10-2223001 | 3/2021 |

* cited by examiner

FIG. 8

| | SCI | SCE |
|---|---|---|
| Scattering particle Non-exist | 6.00 | 0.53 |
| Structure of FIG. 7 | 6.42 | 1.21 |
| Structure of FIG. 6 | 5.83 | 0.85 |

FIG. 9

| | Scattering particle Non-exist | Scattering particle Exist |
|---|---|---|
| Large Halo ~0.1m | | |
| Diffraction ~1m | | |

FIG. 11

| | Scattering particle Non-exist | Scattering particle Exist |
|---|---|---|
| Front luminance ratio | 100.0% | 95.2% |
| 45-degree luminance ratio | 35.2% | 38.9% |

FIG. 13

| Types of scattering particles | Diameter(㎛) | Particle density (ea/㎟) |
|---|---|---|
| $TiO_2$ | 0.1 ~ 1.5 | 1 ~ 10 |
| $Zr_2O_3$ | 0.1 ~ 1.5 | 2 ~ 20 |
| $Al_2O_3$ | 0.1 ~ 1.5 | |
| $SiO_2$(including hollow silica) | 0.1 ~ 1.5 | |
| Acrylate type | 0.2 ~ 5.0 | 3 ~ 30 |
| Silicone type | 0.2 ~ 5.0 | |

FIG. 14

| $TiO_2$ particle size | | Ref (Scattering particle Non-exist) | 220nm | | | 300nm | | | 400nm | | |
|---|---|---|---|---|---|---|---|---|---|---|---|
| Haze(%) | | 0% | 20% | 50% | 80% | 20% | 50% | 80% | 20% | 50% | 80% |
| Light efficiency | 0도 | 100.0% | 80.0% | 54.8% | 31.3% | 83.3% | 60.2% | 37.2% | 84.7% | 64.8% | 40.3% |
| Luminance ratio | 45도 | 40.4% | 41.0% | 47.8% | 65.6% | 41.1% | 47.4% | 60.3% | 41.6% | 45.5% | 58.8% |
| | 60도 | 12.9% | 15.3% | 26.0% | 51.7% | 15.6% | 25.5% | 46.0% | 15.3% | 23.1% | 40.0% |
| Reflectance | SCI | 6.35 | 6.17 | 6.00 | 6.03 | 6.21 | 6.05 | 6.00 | 6.25 | 6.11 | 6.05 |
| | SCE | 0.64 | 0.63 | 0.61 | 0.70 | 0.67 | 0.65 | 0.65 | 0.68 | 0.69 | 0.70 |

FIG. 15

| Types of Spawning Agents | Diameter (μm) | Particle Density (ea/$mm^3$) | Scattering Layer Thickness |
|---|---|---|---|
| $TiO_2$ | 0.2 – 0.6 | 3 – 10 | 1 – 3 μm |

EA3 : SEA1, SEA2

FIG. 27

| Refractive index $\Delta n$ | Ref (Scattering pattern Non-exist) | 0.3 | 0.3 | 0.3 |
|---|---|---|---|---|
| Pattern area ratio | | 57% | 57% | 57% |
| Pattern shape(μm) | | Width 3.4 / Depth 0.1 | Width 3.4 / Depth 0.2 | Width 3.4 / Depth 0.3 |
| Scattering effect | Non | Weak | Weak | Middle |
| Pattern scattering image | | | | |

FIG. 28

| Refractive index Δn | 0.3 | 0.3 | 0.3 |
| --- | --- | --- | --- |
| Pattern area ratio | 36% | 57% | 78% |
| Pattern shape(μm) | Width 3.4 / Depth 0.3 | Width 3.4 / Depth 0.3 | Width 3.4 / Depth 0.3 |
| Scattering effect | Weak | Middle | Strong |
| Pattern scattering image | | | |

FIG. 29

| Refractive index Δn | 0.1 | 0.2 | 0.3 |
| --- | --- | --- | --- |
| Pattern area ratio | 78% | 78% | 78% |
| Pattern shape(μm) | Width 3.4 / Depth 0.3 | Width 3.4 / Depth 0.3 | Width 3.4 / Depth 0.3 |
| Scattering effect | Weak | Middle strong | Strong |
| Pattern scattering image | | | |

FIG. 30

| Refractive index Δn | 0.3 | 0.2 | 0.2 | 0.1 |
| --- | --- | --- | --- | --- |
| Pattern area ratio | 78% | 78% | 78% | 78% |
| Pattern shape(㎛) | Width 3.4 / Depth 0.3 | Width 3.4 / Depth 0.3 | Width 3.4 / Depth 0.5 | Width 3.4 / Depth 0.5 |
| Scattering effect | Strong | Strong | Strong | Middle strong |
| Pattern scattering image | | | | |

FIG. 32

| | Front luminance ratio | 45-degree luminance ratio |
|---|---|---|
| REF(Scattering particle /scattering pattern Non-exist) | 100% | 37.3% |
| Scattering pattern | 99.5% | 38% |
| Scattering particle | 80~85% | 40% |

EMISSIVE DISPLAY DEVICE INCLUDING A SCATTERING LAYER

CROSS-REFERENCE TO RELATED APPLICATION

This application claims priority under 35 U.S.C. § 119 to Korean Patent Application No. 10-2022-0186131, filed in the Korean Intellectual Property Office on Dec. 27, 2022, the entire contents of which are herein incorporated by reference.

TECHNICAL FIELD

The present disclosure relates to a display device, and more particularly, to an emissive display device including a scattering layer.

DISCUSSION OF THE RELATED ART

A display device is a device that displays images and is therefore widely used in a range of products. Common types of display devices include a liquid crystal display (LCD) device, an organic light emitting diode (OLED) display device, and the like. Such a display device is used in various electronic devices such as mobile phones, navigation units, digital cameras, electronic books, portable game consoles, and various electronic terminals.

A display device such as an organic light emitting diode display may have a flexible structure in which the display device can be bent or folded to a noticeable extent without cracking or otherwise sustaining damage.

An emissive display device is a self-emitting display device and displays an image by emitting light from a light emitting element.

The liquid crystal display device displays an image by adjusting a degree of light blocking provided by a light unit, and two polarizers are formed on top and bottom as well as on a liquid crystal layer to selectively block light, thereby producing the desired image.

Accordingly, an emissive display device may generally display an image without including a polarizer unlike a liquid crystal display.

SUMMARY

An emissive display device includes a substrate. A first electrode is disposed on the substrate. A pixel defining layer has a first opening exposing the first electrode. A second electrode is disposed on the pixel defining layer and on the first electrode. An encapsulation layer at least partially covers the second electrode. A light blocking layer is disposed on the encapsulation layer having a second opening. A color filter is disposed on the light blocking layer. A scattering layer is disposed within the second opening of the light blocking layer and includes a plurality of scattering particles. Particle density of the scattering particles has a value of 1 ea/mm$^3$ or more and 10 ea/mm$^3$ or less, and a diameter of the scattering particles is 0.1 μm or more and 1.5 μm or less.

The scattering particles may include a titanium oxide.

The scattering layer may have a thickness of 1 μm or more and 3 μm or less.

Particle density of the titanium oxide may have a value of 3 or more and 8 ea/mm$^3$ or less, and a diameter of the titanium oxide may be 0.2 μm or more and 0.6 μm or less.

An emissive display device includes a substrate. A first electrode is disposed on the substrate. A pixel defining layer has a first opening exposing the first electrode. A second electrode is disposed on both the pixel defining layer and the first electrode. An encapsulation layer at least partially covers the second electrode. A light blocking layer is disposed on the encapsulation layer having a second opening. A color filter is disposed on the light blocking layer. A scattering layer is disposed within the second opening of the light blocking layer and includes a plurality of scattering particles. Particle density of the scattering particles has a value of 2 ea/mm$^3$ or more and 20 ea/mm$^3$ or less, and a diameter of the scattering particles is 0.1 μm or more and 1.5 μm or less.

The scattering particles may include a zirconium oxide, an aluminum oxide, a silicon oxide, and/or a hollow silica.

The hollow silica may have a structure in which a three-dimensional silicon oxide particle contains an empty space.

Particle density of the hollow silica may have a value of 3 ea/mm$^3$ or more and 8 ea/mm$^3$ or less, a diameter of the hollow silica may be 0.2 μm or more and 0.6 μm or less, and a thickness of the scattering layer including the hollow silica may be 1 μm or more and 3 μm or less.

An emissive display device includes a substrate. A first electrode is disposed on the substrate. A pixel defining layer has a first opening exposing the first electrode. A second electrode is disposed on both the pixel defining layer and the first electrode. An encapsulation layer at least partially covers the second electrode. A light blocking layer is disposed on the encapsulation layer having a second opening. A color filter is disposed on the light blocking layer. A scattering layer is disposed within the second opening of the light blocking layer and includes a plurality of scattering particles. Particle density of the scattering particles has a value of 3 ea/mm$^3$ or more and 30 ea/mm$^3$ or less, and a diameter of the scattering particles is 0.2 μm or more and 5.0 μm or less.

The scattering particles may include an acrylate-based material and/or a silicon-based material.

An emissive display device includes a substrate. A first electrode is disposed on the substrate. A pixel defining layer has a first opening exposing the first electrode. A second electrode is disposed on both the pixel defining layer and the first electrode. An encapsulation layer at least partially covers the second electrode. A light blocking layer is disposed on the encapsulation layer and has a second opening. A color filter is disposed on the light blocking layer. A scattering layer includes a plurality of scattering patterns at least partially overlapping the second opening of the light blocking layer. A pattern area ratio of the scattering patterns has a value of 30% or more and less than 100%.

A ratio of a depth to a depth of the scattering patterns may have a value of 0.05 or more, and a maximum value of the depth of the scattering patterns may be obtained when the scattering patterns extend through the scattering layer.

A difference between the refractive indices of two materials disposed at opposite sides of one side of the scattering patterns as a boundary may have a value of 0.05 or more.

At least two scattering patterns among the scattering patterns may have different diameters.

The color filter may be disposed within the scattering patterns.

The emissive display device may further include a transparent organic portion disposed in the second opening of the light blocking layer, and the transparent organic portion may be disposed within the scattering patterns.

The encapsulation layer may sequentially include a first encapsulation layer, a second encapsulation layer, and a third encapsulation layer. The first encapsulation layer and the third encapsulation layer may be inorganic encapsulation layers. The second encapsulation layer may be an organic encapsulation layer. The uppermost third encapsulation layer and the scattering layer may be a single integral structure. The scattering patterns may be disposed in the third encapsulation layer.

The scattering layer may be disposed within the second opening of the light blocking layer.

The scattering layer and the scattering patterns may be formed through a phase separation process.

The scattering patterns may be arranged along the pixel defining layer exposed by the second opening of the light blocking layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 8 to FIG. 12 are views comparing comparative examples and examples.

FIG. 13 to FIG. 15 are tables showing characteristics of scattering particles according to embodiments.

FIG. 25 to FIG. 30 are diagrams illustrating differences according to characteristics of scattering patterns.

FIG. 32 is a table comparing characteristics of an embodiment including scattering particles and an embodiment including scattering patterns.

DETAILED DESCRIPTION

Embodiments of the present invention will be described more fully hereinafter with reference to the accompanying drawings. As those skilled in the art would realize, the described embodiments may be modified in various different ways, all without departing from the spirit or scope of the present disclosure.

Like numerals may refer to like or similar constituent elements throughout the specification and the drawings.

It will be understood that when an element such as a layer, film, region, plate, constitute elements, etc. is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means when an object portion is viewed from above, and the phrase "in a cross-sectional view" means when a cross-section taken by vertically cutting an object portion is viewed from the side.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In addition, throughout the specification, when it is said that a portion of a wire, layer, film, region, plate, component, etc., "extends in a first direction or a second direction," this does not necessarily indicate only a straight shape extending straight in the corresponding direction, and may indicate a structure that generally extends along the first direction or the second direction, and it may include a structure that is bent at a portion, has a zigzag structure, or extends while including a curved structure.

In addition, an electronic device (e.g., a mobile phone, TV, monitor, notebook computer, etc.) including a display device, a display panel, etc. described in the specification, or an electronic device including a display device and a display panel manufactured by the manufacturing method described in the specification, are not excluded from the scope of the present specification.

Hereinafter, embodiments will be described with reference to the accompanying drawings.

Figure 1:
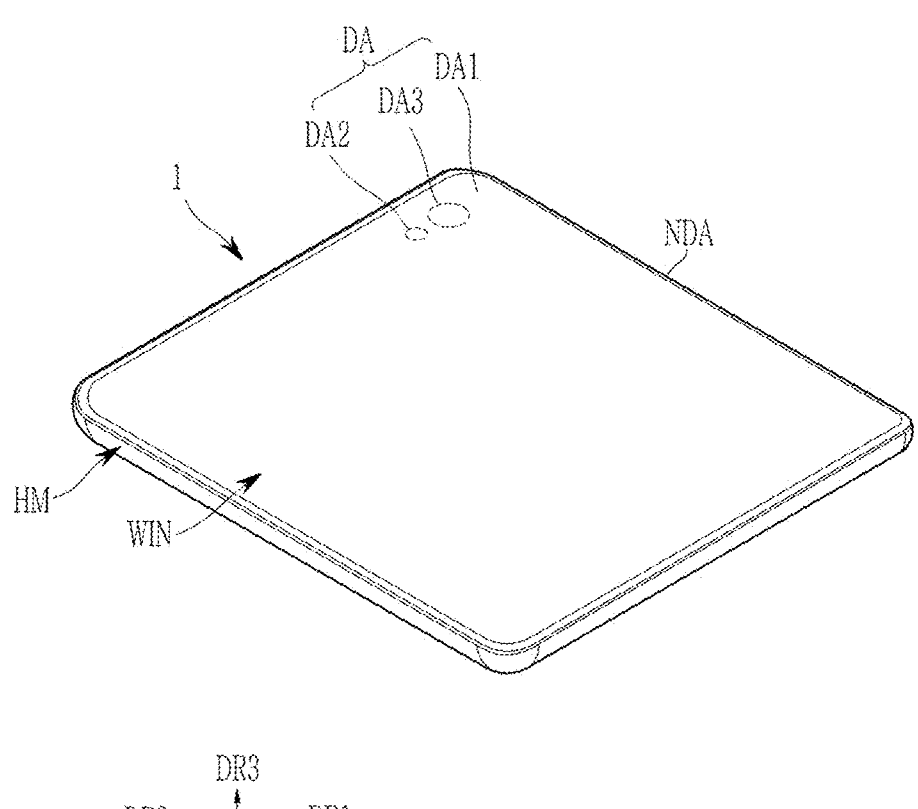
FIG. 1 is a schematic perspective view of an electronic device according to an embodiment.

FIG. 1 is a schematic perspective view of an electronic device according to an embodiment.

Referring to FIG. 1, an electronic device, which is an electronic device providing a display screen capable of displaying moving images or still images in a third direction DR3, may include, e.g., a mobile phone, a smart phone, a tablet personal computer (PC), an electronic watch, a smart watch, a watch phone, a head-mounted display, a mobile communication terminal, an electronic notebook, an electronic book, a portable multimedia player, a navigation, a game console, a digital camera, a camcorder, etc.

Figure 2:
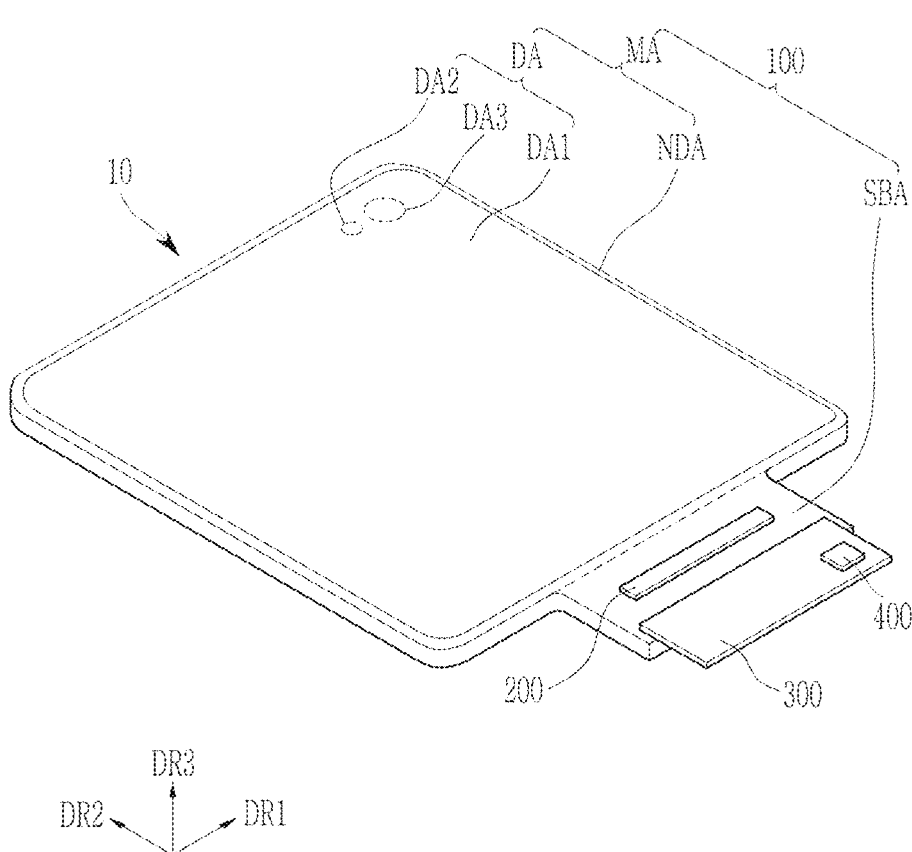
FIG. 2 is a perspective view of an emissive display device included in an electronic device according to an embodiment.

The electronic device 1 includes a cover window WIN and a housing HM, and an emissive display device 10 illustrated in FIG. 2 may be disposed inside the cover window WIN and the housing HM. Accordingly, the cover window WIN and the housing HM may be combined to form an outer appearance of the electronic device 1.

The cover window WIN may include an insulating panel. For example, the cover window WIN may include glass, plastic, crystal, or a combination thereof. According to an embodiment, the cover window WIN may include a touch sensing unit capable of sensing a touch.

A front surface of the cover window WIN may define a front surface of the electronic device 1.

The housing HM may be coupled to the cover window WIN. The cover window WIN may be disposed on the front surface of the housing HM. The housing HM may be coupled to the cover window WIN to provide a predetermined accommodation space. The emissive display device 10 may be accommodated in a predetermined accommodation space provided between the housing HM and the cover window WIN.

The housing HM may include a material having a relatively high rigidity (e.g., a rigid material). For example, the housing HM may include a plurality of frames and/or plates made of glass, plastic, metal, or a combination thereof. The housing HM has a rear surface and a side surface, the cover window WIN is disposed at an upper portion of the housing HM, and components of the emissive display device 10 accommodated in an inner space formed by the housing HM and the cover window WIN may be stably protected from external impact.

The electronic device 1 may include a display device (refer to 10 in FIG. 2) providing a display screen in the third direction DR3. As the display device included in the electronic device 1, various display devices such as an inorganic light emitting diode display, an organic light emitting diode display, and a quantum dot emissive display device may be used. Hereinafter, a case in which an emissive display device including an organic light emitting element is applied as an example of the display device will be mainly described, but the present invention is not necessarily limited thereto, and when a same technical idea is applicable, it may be applied to another display device as well.

A shape of the electronic device 1 may be variously modified. For example, the electronic device 1 may have a shape such as a horizontally long rectangle, a vertically long rectangle, a square, a rectangle with rounded corners, other polygons, or a circle. A shape of the display area DA of the electronic device 1 may also be similar to an overall shape of the electronic device 1. In FIG. 1, the electronic device 1 having a relatively long rectangular shape in a first direction DR1 is illustrated, but is not necessarily limited thereto.

The electronic device 1 may include a display area DA and a non-display area NDA. The display area DA and the non-display area NDA illustrated in FIG. 1 may correspond to the display area DA and the non-display area NDA of the emissive display device 10. The display area DA is an area where a screen is displayed, and the non-display area NDA is an area where the screen is not displayed. The display area DA occupies most of an area around a center of the electronic device 1, and the non-display area NDA may have a structure at least partially surrounding the display area DA.

The display area DA may include a first display area DA1, a second display area DA2, and a third display area DA3. The second display area DA2 and the third display area DA3, which are areas in which a component such as a sensor or a camera for adding various functions to the electronic device 1 is disposed on a rear surface (a surface positioned below in the third direction DR3), may correspond to component areas. The second display area DA2 and the third display area DA3 may be at least partially surrounded by the first display area DA1. In addition to the first display area DA1, both the second display area DA2 and the third display area DA3 may display images. Positions and numbers of the second display area DA2 and the third display area DA3 may be variously changed according to an embodiment.

Hereinafter, a structure of an emissive display device, which is an example of a display device, will be described with reference to FIG. 2.

FIG. 2 is a perspective view of an emissive display device included in an electronic device according to an embodiment.

FIG. 2 is a perspective view of an emissive display device included in an electronic device according to an embodiment.

Referring to FIG. 2, the display device 1, according to an embodiment, includes an emissive display device 10. The emissive display device 10 may serve to display a screen on the electronic device 1, and may detect or photograph a front surface of the electronic device 1. The emissive display device 10 may have a flat shape similar to that of the electronic device 1. For example, the emissive display device 10 may have a shape similar to a quadrilateral having a side in the first direction DR1 and a side in the second direction DR2. A corner where the side in the first direction DR1 and the side in the second direction DR2 meet may be formed round having a curvature, but may be formed at a right angle without necessarily being limited thereto. The flat shape of the emissive display device 10 is not necessarily limited to a quadrilateral, and may be formed similarly to another polygon, a circular shape, or an elliptical shape.

The emissive display device 10 may include a display panel 100, a display driver 200, a circuit board 300, and a touch driver 400.

The display panel 100 may include a main area MA and a subarea SBA.

The main area MA may include a display area DA including pixels displaying an image, and a non-display area NDA disposed around the display area DA. The display area DA may include a first display area DA1, a second display area DA2, and a third display area DA3. The second display area DA2 and the third display area DA3 not only include pixels, but also components such as sensors or cameras are disposed at a lower portion in the third direction DR3, and the second display area DA2 and the third display area DA3 may correspond to component areas.

The display area DA may emit light in the third direction DR3 from a plurality of emission areas corresponding to the light emitting elements. For example, the display panel 100 may include a pixel circuit unit including a transistor and a pixel defining layer including a light emitting element and having an opening defining a light emitting area of the light emitting element. Herein, the light emitting element may include an organic light emitting diode including an organic light emitting layer, a quantum dot light emitting diode (quantum dot LED) including a quantum dot emission layer, an inorganic light emitting diode (inorganic LED) including an inorganic semiconductor, and/or a micro LED, but the present invention is not necessarily limited thereto.

The non-display area NDA, which is an area outside the display area DA, at least partially surrounds the display area DA. The non-display area NDA may be defined as an edge area of the main area MA of the display panel 100. The non-display area NDA may include a gate driver supplying gate signals to gate lines, and fan outline lines connecting the display driver 200 and the display area DA.

The subarea SBA may be an area extending from a first side of the main area MA. The subarea SBA may include a flexible material capable of being bent, folded, or rolled to a noticeable extent without cracking or otherwise sustaining damage. For example, when the subarea SBA is bent, the subarea SBA may overlap the main area MA in a thickness direction (e.g., third direction DR3). The subarea SBA may include a pad portion connected to the display driver 200 and the circuit board 300. In an embodiment, the subarea SBA may be omitted, and the display driver 200 and the pad portion may be disposed in the non-display area NDA.

The display driver 200 may output signals and voltages for driving the display panel 100. The display driver 200 may supply data voltages to data lines. The display driver 200 may supply a power voltage to a power line, and may supply a gate control signal to a gate driver. The display driver 200 may include an integrated circuit (IC) to be mounted in the display panel 100 using a chip on glass (COG) method, a chip on plastic (COP) method, or an ultrasonic bonding method. For example, the display driver 200 may be disposed in the subarea SBA, and may overlap the main area MA in the thickness direction (e.g., third direction DR3) by bending the subarea SBA. For example, the display driver 200 may be mounted in the circuit board 300.

The circuit board 300 may be attached to the pad portion of the display panel 100 using an anisotropic conductive film (ACF). Lead lines of the circuit board 300 may be electrically connected to the pad portion of the display panel 100. The circuit board 300 may be a flexible printed circuit board, a printed circuit board, or a flexible film such as a chip on film.

The touch driver 400 may be mounted on the circuit board 300. The touch driver 400 may be electrically connected to a touch sensor included in electronic device 1. The touch driver 400 may supply a touch driving signal to a plurality of sensing electrodes of the touch sensor, and may sense a change in capacitance between the sensing electrodes. For example, the touch driving signal may be a pulse signal having a predetermined frequency. The touch driver 400 may calculate whether or not an input has been made and input coordinates based on a capacitance variation between the sensing electrodes. The touch driver 400 may include an integrated circuit (IC).

Hereinafter, a cross-sectional structure of the emissive display device 10 will be described with reference to FIG. 3.

Figure 3:
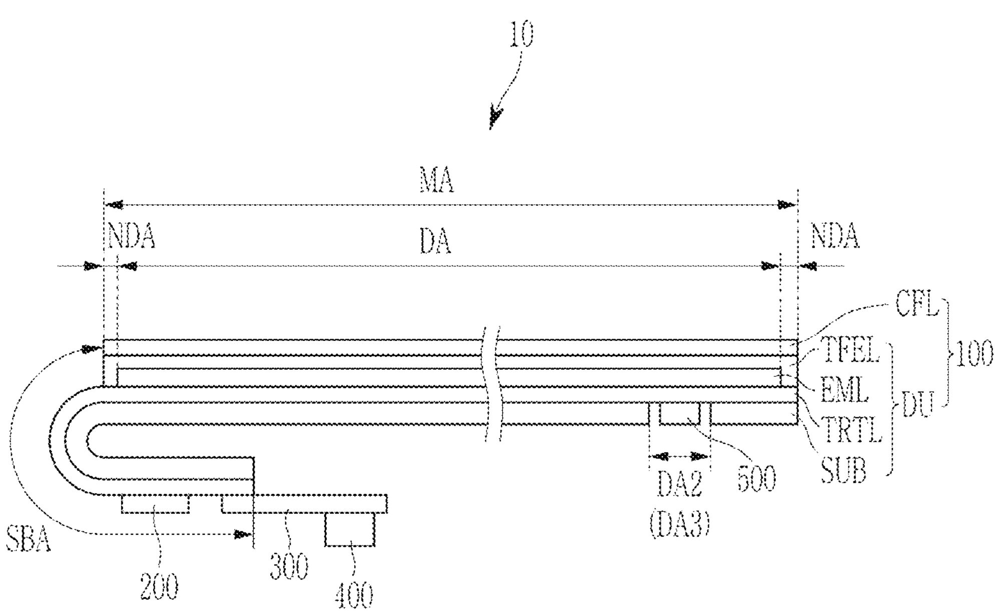
FIG. 3 is a cross-sectional view of the emissive display device of FIG. 2.

FIG. 3 is a cross-sectional view of the emissive display device of FIG. 2.

Referring to FIG. 3, the display panel 100 may include a display layer DU and an external light reducing layer CFL. The display layer DU may include a substrate SUB, a driving element layer TFTL, a light emitting element layer EML, and an encapsulation layer TFEL.

The substrate SUB may be a base substrate or a base member. The substrate SUB may be a flexible substrate capable of being bent, folded, or rolled to a noticeable extent without cracking or otherwise sustaining damage. For example, the substrate SUB may include a polymer resin such as polyimide (PI), but the present invention is not necessarily limited thereto. In an embodiment, the substrate SUB may include a glass material or a metal material.

The driving element layer TFTL may be disposed on the substrate SUB. The driving element layer TFTL may include a plurality of transistors and capacitors constituting a pixel circuit unit that outputs and transfers a current to the light emitting element. The driving element layer TFTL may further include gate lines, data lines, power lines, gate control lines, fan out lines connecting the display driver 200 and the data lines, and lead lines connecting the display driver 200 and the pad portion. Each of the transistors may include a semiconductor including a channel region, a source region, and a drain region, and a gate electrode disposed at a side of the semiconductor. Herein, the source region and the drain region of the semiconductor may serve as a source electrode (e.g., first electrode) and a drain electrode (e.g., second electrode) of each of the transistors, respectively. In addition, when the gate driver is formed at a first side of the non-display area NDA of the display panel 100, the gate driver may include transistors.

The driving element layer TFTL may be disposed in the display area DA, the non-display area NDA, and the subarea SBA. The transistors, the gate lines, data lines, and power lines of the driving element layer TFTL may be disposed in the display area DA. The gate control lines and the fan out lines of the driving element layer TFTL may be disposed in the non-display area NDA. The lead lines of the driving element layer TFTL may be disposed in the subarea SBA.

In the light emitting element layer EML, a light emitting element and an emission area corresponding to the light emitting element are disposed, and it may be disposed on the driving element layer TFTL. The light emitting element layer EML may include a plurality of light emitting elements including a first electrode, a second electrode, and a light emitting layer that emits light, and a pixel defining layer having an opening defining an emission area. The light emitting elements of the light emitting element layer EML may be disposed in the display area DA.

In an embodiment, the emission layer may be an organic light emitting layer including an organic material. A functional layer including an electron injection layer, an electron transport layer, a hole transport layer, and/or a hole injection layer may be disposed at opposite sides of the emission layer. Herein, a combination of the emission layer and the functional layer may be referred to as an intermediate layer. The first electrode receives a voltage through a transistor of the driving element layer TFTL, and when the second electrode receives a driving low voltage, holes and electrons may move to the organic light emitting layer through the hole transport layer and the hole transport layer and the electron transport layer and the electron transport layer, respectively, and they may be combined with each other in the organic light emitting layer to emit light. Herein, one of the first electrode and the second electrode may be an anode, and the other may be a cathode.

In an embodiment, the light emitting element may be a quantum dot light emitting diode including a quantum dot light emitting layer, an inorganic light emitting diode including an inorganic semiconductor, or a micro light emitting diode.

The encapsulation layer TFEL may cover the upper and side surfaces of the light emitting element layer EML, and may protect the light emitting element layer EML to prevent external moisture and air from entering it. The encapsulation layer TFEL may include at least one inorganic layer and at least one organic layer for encapsulating the light-emitting element layer EML.

The external light reducing layer CFL may be disposed on the encapsulation layer TFEL. The external light reducing layer CFL may include a plurality of color filters corresponding to each of a plurality of emission areas. In addition, a light blocking layer may at least partially overlap adjacent color filters of the external light reducing layer CFL or in an overlapping portion where adjacent color filters overlap. The light blocking layer may be disposed above or below the color filters in the third direction DR3, or may be disposed at opposite sides.

Since the external light reducing layer CFL is directly disposed on the encapsulation layer TFEL, the emissive display device 10 might not require a separate substrate for the external light reducing layer CFL. In addition, a polarizing plate is not attached at an upper portion of the external light reducing layer CFL. As a result, a thickness of the emissive display device 10 may be relatively small. In addition, since the polarizer is not included in the emissive display device 10, external light may be reflected, but that reflection of external light is reduced by a color filter or a light blocking layer included in the external light reducing layer CFL. For example, the color filters may selectively transmit light of a specific wavelength, and may block or absorb light of other wavelengths, and the light blocking layer may absorb external light, and thus an amount of external light flowing into the emissive display device 10 may be reduced and an amount of reflected light may also be reduced, thereby reducing problems caused by reflection of external light.

According to an embodiment, the emissive display device 10 may further include an optical device 500. The optical device 500 may be disposed on a rear surface of the second display area DA2 or the third display area DA3. The optical device 500 may emit or receive light in infrared, ultraviolet, and visible light bands. For example, the optical device 500 may be an optical sensor that detects light incident on the emissive display device 10, such as a proximity sensor, an illuminance sensor, a camera sensor, or an image sensor.

Hereinafter, a connection relationship of components included in the emissive display device 10 will be described in detail with reference to FIG. 4.

Figure 4:
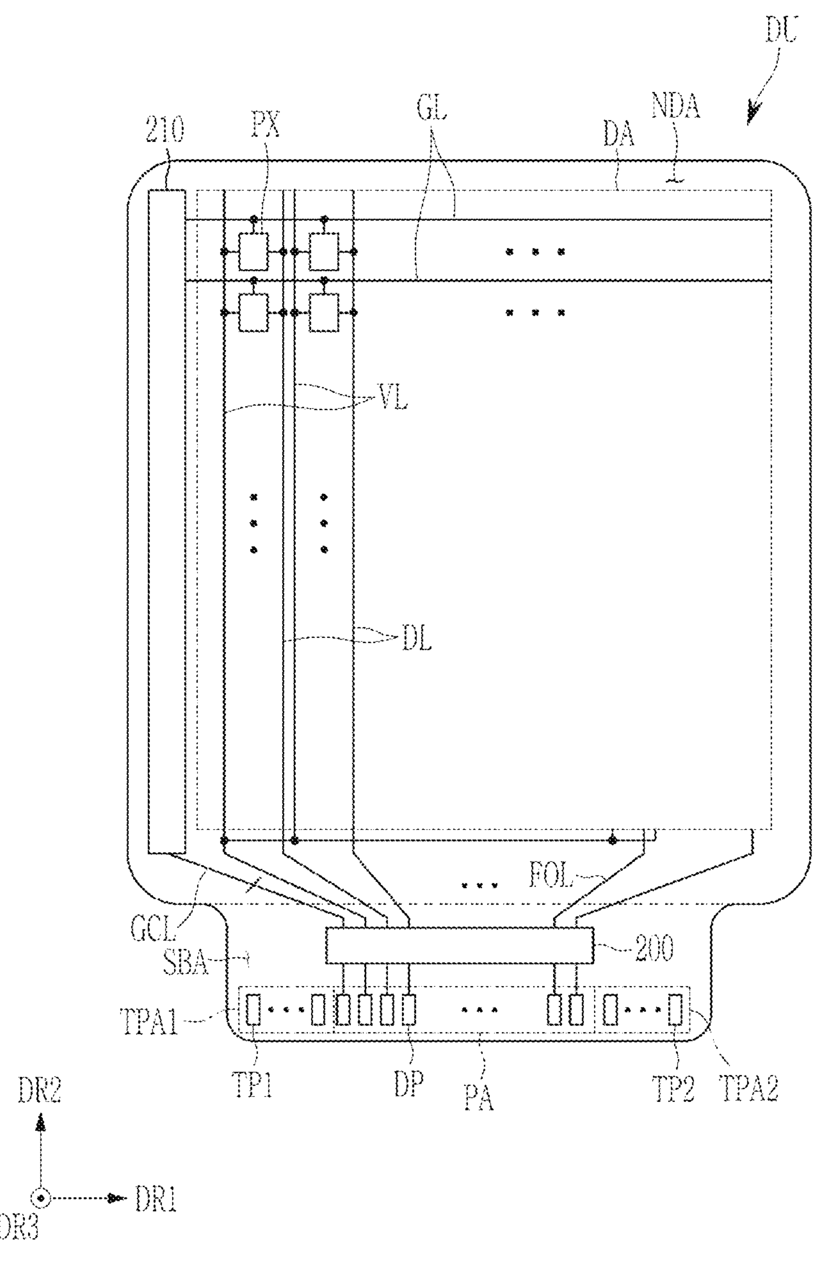
FIG. 4 is a schematic top plan view showing a connection relationship between components of an emissive display device according to an embodiment.

FIG. 4 is a schematic top plan view showing a connection relationship between components of an emissive display device according to an embodiment.

Referring to FIG. 4, the display layer DU of the emissive display device 10 may include a display area DA and a non-display area NDA.

The display area DA may be disposed at a center of the display panel 100. A plurality of unit pixels PX, a plurality of gate lines GL, a plurality of data lines DL, and a plurality of power lines VL may be disposed in the display area DA. Each of the unit pixels PX, which is a minimum unit that emits light, includes a pixel circuit unit including a transistor and a capacitor and a light emitting element that receives a current from the pixel circuit unit.

Each of the unit pixels PX may be connected to a gate line GL, a data line DL, and a power line VL, and each of the gate line GL and the power line VL may include a plurality of lines.

The gate lines GL may supply gate signals received from the gate driver 210 to the unit pixels PX. The gate lines GL may extend in the first direction DR1, and may be spaced apart from each other in the second direction DR2 crossing the first direction DR1.

The data lines DL may supply the data voltages received from the display driver 200 to the unit pixels PX. The data lines DL may extend in the second direction DR2, and may be spaced apart from each other in the first direction DR1.

The power lines VL may supply the power voltages received from the display driver 200 to the unit pixels PX. Herein, the power supply voltage may be a driving voltage, an initialization voltage, a reference voltage, or a driving low voltage, and/or a plurality of power supply voltages may be transmitted to the unit pixels PX among the power supply voltages. The power lines VL may extend in the second direction DR2, and may be spaced apart from each other in the first direction DR1.

The non-display area NDA may at least partially surround a periphery of the display area DA. The gate driver 210, the fan out lines FOL, and the gate control lines GCL may be disposed in the non-display area NDA.

The gate driver 210 may generate a plurality of gate signals based on a gate control signal, and may sequentially supply a plurality of gate signals to the gate lines GL depending on a predetermined order.

The fan out lines FOL may extend from the display driver 200 to the display area DA. The fan out lines FOL may supply the data voltages received from the display driver 200 to the data lines DL.

The gate control lines GCL may extend from the display driver 200 to the gate driver 210. The gate control lines GCL may supply gate control signals received from the display driver 200 to the gate driver 210.

Referring to FIG. 4, the emissive display device 10 may further include a subarea SBA.

The subarea SBA may include the display driver 200, the pad area PA, and the first and second touch pad areas TPA1 and TPA2.

The display driver 200 may output signals and voltages for driving the display panel 100 to the fan out lines FOL. The display driver 200 may supply the data voltages to the data lines DL through the fan-out lines FOL. The data voltages may be supplied to the unit pixels PX, and may control luminance of the unit pixels PX. The display driver 200 may supply a gate control signal to the gate driver 210 through the gate control line GCL.

The pad area PA, the first touch pad area TPA1, and the second touch pad area TPA2 may be disposed at edges of the subarea SBA. The pad area PA may include a plurality of display pad portions DP. The display pad portions DP may be connected to a graphics system through the circuit board 300. The display pad portions DP may receive digital video data by being connected to the circuit board 300 and to supply the digital video data to the display driver 200. The first touch pad area TPA1 and the second touch pad area TPA2 each may include a plurality of touch pads TP1 and TP2, and may be connected to the touch driver 400 disposed on the circuit board 300 to sense a touch. The pad area PA, the first touch pad area TPA1, and the second touch pad area TPA2 may be electrically connected to the circuit board 300 by using a material such as an anisotropic conductive film or a SAP (self assembly anisotropic conductive paste).

Figure 6:
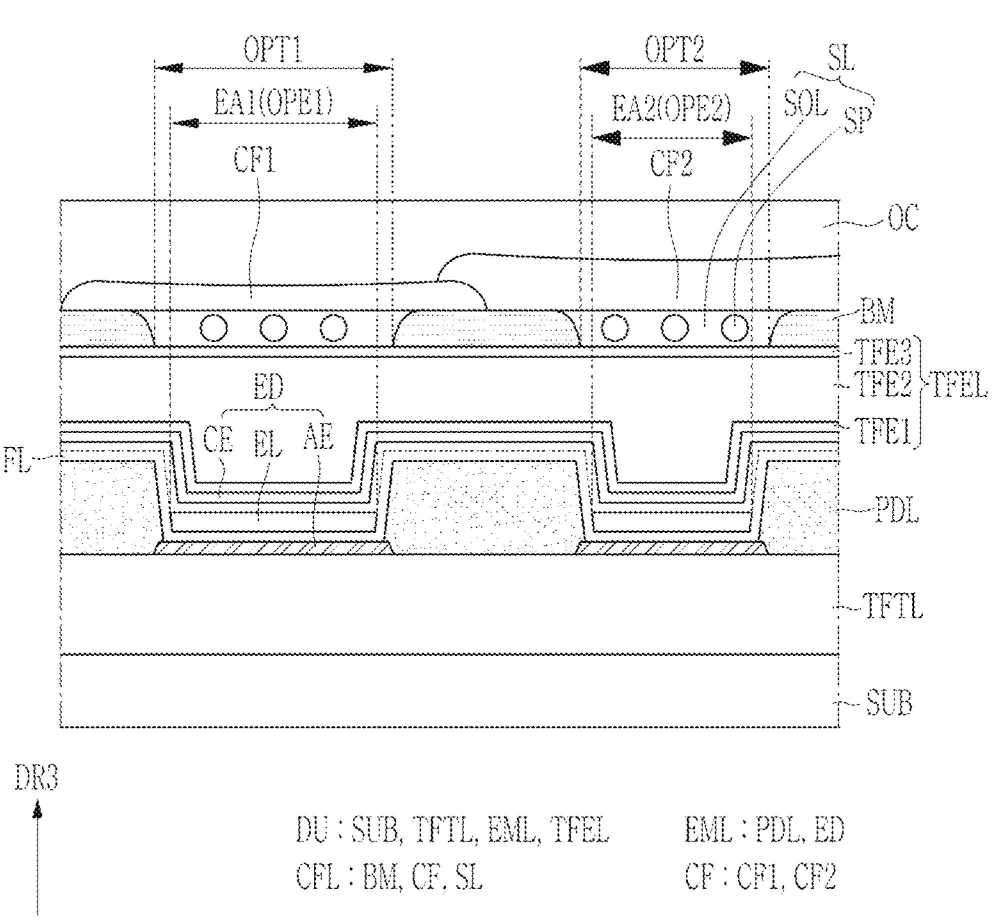
FIG. 6 and FIG. 7 are schematic cross-sectional views of an emissive display device according to an embodiment.
Figure 7:
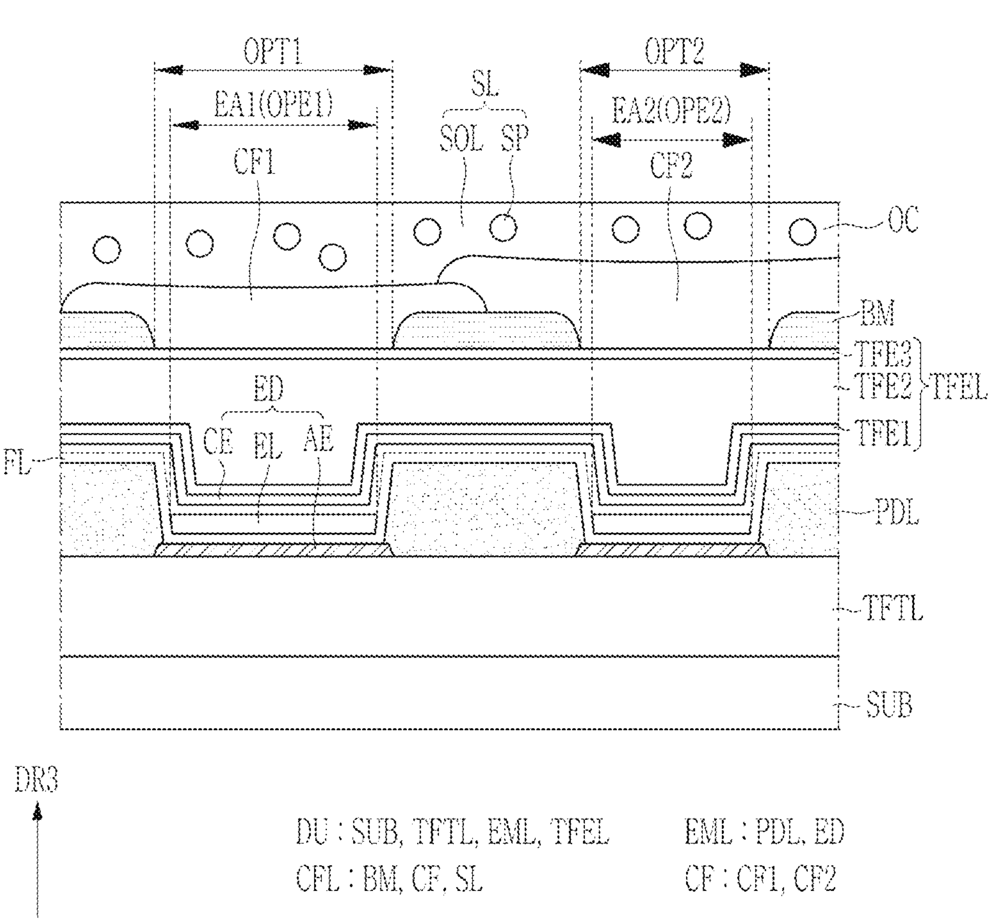

Hereinafter, the positional relationship between an opening of a pixel defining layer disposed on the light emitting element layer EML and a color filter and a light blocking layer disposed on the external light reducing layer CFL will be described based on a plan view using FIG. 5. Referring to FIG. 6 and FIG. 7, scattering particles may be disposed in a portion overlapping the opening of the pixel defining layer.

Figure 5:
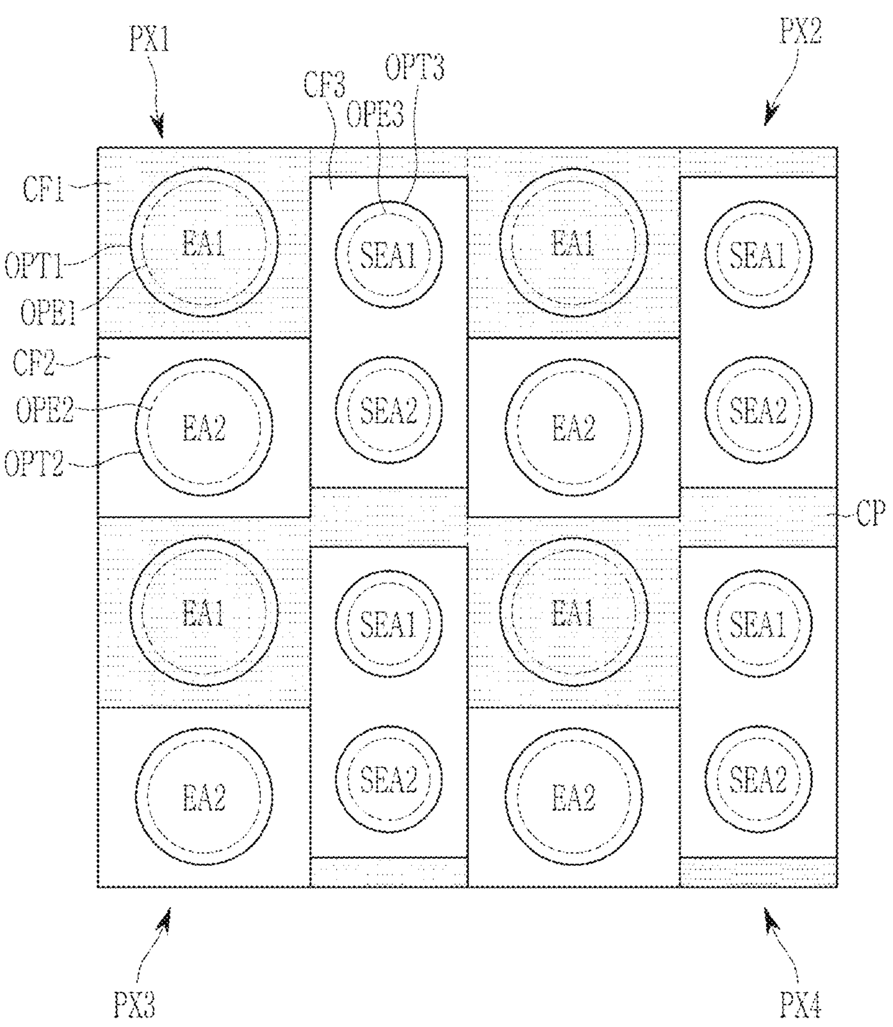
FIG. 5 is a top plan view schematically showing a display area of an emissive display device according to an embodiment.
Figure 5:
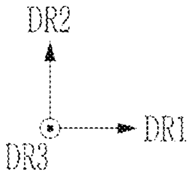

FIG. 5 is a top plan view schematically showing a display area of an emissive display device according to an embodiment.

In FIG. 5, disposition of the emission area, the color filter, and the light blocking layer in the display area is mainly illustrated.

In FIG. 5, openings OPE1, OPE2, and OPE3 (hereinafter referred to as first openings) of the pixel defining layers and the light blocking layer openings OPT1, OPT2, and OPT3 (hereinafter referred to as second openings) are illustrated in a circular shape, and the color filters CF1, CF2, and CF3 are illustrated separated by straight lines.

The openings OPE1, OPE2, and OPE3 of the pixel defining film and the openings OPT1, OPT2, and OPT3 of the light blocking layer may have a circular shape in a plan view, and due to the circular shape, reflected light may be reflected without having a specific direction, thereby reducing reflection characteristics. When the flat shape of the openings has a corner, the reflection is well recognized in a corresponding direction, and thus openings having a circular shape with no corner may have a lower reflection characteristic.

Referring to FIG. 5, the emissive display device 10 may include a plurality of unit pixels PX1, PX2, PX3, and PX4 disposed in the display area DA, and emission areas EA1, EA2, and EA3 disposed in each of the unit pixels PX1, PX2, PX3, and PX4. The display area DA illustrated in FIG. 5 may be the first display area DA1, and the unit pixels PX1, PX2, PX3, and PX4 and the emission areas EA1, EA2, and EA3 may be disposed in the first display area DA1. However, the unit pixels PX1, PX2, PX3, and PX4 and the emission areas EA1, EA2, and EA3 may be disposed in the second display area DA2 and the third display area DA3 of the display area DA.

The unit pixels PX1, PX2, PX3, and PX4 may include the emission areas EA1, EA2, and EA3 displaying different colors, and may be arranged in the first direction DR1 and the second direction DR2. The first unit pixel PX1 and the second unit pixel PX2 may be disposed adjacent to each other in the first direction DR1, and the first unit pixel PX1 and the third unit pixel PX3 may be disposed adjacent to each other in the second direction DR2. The third unit pixel PX3 and the fourth unit pixel PX4 may be disposed adjacent to each other in the first direction DR1, and the second unit pixel PX2 and the fourth unit pixel PX4 may be disposed adjacent to each other in the second direction DR2. However, a disposition or arrangement of the unit pixels PX1, PX2, PX3, and PX4 is not necessarily limited to that illustrated in FIG. 5. According to an embodiment, the unit pixels PX1, PX2, PX3, and PX4 may be disposed in a Pentile™ type, e.g., a diamond Pentile™ type.

The emission areas EA1, EA2, and EA3 of each of the unit pixels PX1, PX2, PX3, and PX4 may include a first emission area EA1, a second emission area EA2, and a third emission area EA3 emitting light of different colors. Unlike the first emission area EA1 and the second emission area EA2, the third light emitting area EA3 may include a plurality of sub-emission areas SEA1 and SEA2 spaced apart from each other. The third emission area EA3 may include a first sub-emission area SEA1 and a second sub-emission area SEA2 spaced apart from the first sub-emission area SEA2 in the second direction DR2. Although the first sub-emission area SEA1 and the second sub-emission area SEA2 are structurally separated, one third emission area EA3 may be formed by emitting light of a same color.

The first to third emission areas EA1, EA2, and EA3 may emit red, green, or blue light, respectively, and a color of light emitted from each of the emission areas EA1, EA2, and EA3 may be different depending on type of the light emitting layer EL (in FIG. 6) among the light emitting elements ED (in FIG. 6) disposed in the light emitting element layer EML, which will be described later. In an embodiment, the first emission area EA1 emits first red light, the second emission area EA2 emits green second light, and the third emission area EA3 or the sub-emission areas SEA1 and SEA3 of the third emission area EA3 may emit blue third light.

The emission areas EA1, EA2, and EA3 may have a circular shape in a plan view. However, the present invention is not necessarily limited thereto, but having a planar structure having no corners may have reduced reflection characteristics. Accordingly, the emission areas EA1, EA2, and EA3 may have an elliptical shape, a circular shape, or a shape similar thereto.

The emission areas EA1, EA2, and EA3 within the unit pixels PX1, PX2, PX3, and PX4 may be disposed in the first direction DR1, the second direction DR2, or in a diagonal direction therebetween. For example, the first emission area EA1 and the second emission area EA2 are spaced apart from each other in the second direction DR2 within each of the unit pixels PX1, PX2, PX3, and PX4. According to an embodiment, the first emission area EA1 and the second emission area EA2 may be alternately disposed in the second direction DR2 on an entire surface of the display area DA. The first emission area EA1 of the third unit pixel PX3 is disposed between the second emission area EA2 of the first unit pixel PX1 and the second emission area EA2 of the third unit pixel PX3.

The third emission area EA3 may be spaced apart from the first emission area EA1 and the second emission area EA2 in the first direction DR1 or in a diagonal direction within each of the unit pixels PX1, PX2, PX3, and PX4. The third emission area EA3 has a shorter length than a length in the second direction DR2 that the first emission area EA1 and the second emission area EA2 have together. In the embodiment of FIG. 5, the third emission area EA3 is disposed at opposite sides based on a center of lengths of the first emission area EA1 and the second emission area EA2 in the second direction DR2, and a color pattern CP is disposed at opposite sides of the third emission area EA3. Herein, the color pattern CP may protrude from the first color filter CF1 in the first direction DR1, may include a same material as that of the first color filter CF1, and may be a portion integrated with the first color filter CF1.

According to an embodiment, disposition of the color patterns CP may be different from that of FIG. 5, according to an embodiment, the color pattern CP is disposed exclusively at a first side of one third emission area EA3, and two third emission areas EA3 adjacent in the second direction DR2 may contact each other.

A disposition of the sub-emission areas SEA1 and SEA2 of the third emission area EA3 may be different for each of the unit pixels PX1, PX2, PX3, and PX4. For example, in the first unit pixel PX1 and the fourth unit pixel PX4, the first sub-emission area SEA1 may be disposed adjacent to the first emission area EA1 and spaced apart from the first emission area EA1 and the second emission area EA2 in a diagonal direction. The second sub-emission area SEA2 may be spaced apart from the second emission area EA2 in the first direction DR1. In the second unit pixel PX2 and the third unit pixel PX3, the first sub-emission area SEA1 may be spaced apart from the first emission area EA1 in the first direction DR1. The second sub-emission area SEA2 may be spaced apart from the first emission area EA1 and the second emission area EA2 in a diagonal direction and disposed adjacent to the second emission area EA2. A difference in a disposition of the third emission area EA3 in the different unit pixels PX1, PX2, PX3, and PX4 may depend on a disposition of the color filters CF1, CF2, and CF3 and the color pattern CP.

A plurality of third emission areas EA3 or the sub-emission areas SEA1 and SEA2 of the third emission areas EA3 may be repeatedly disposed in the second direction DR2. For example, a pair of first and second sub-emission areas SEA1 and SEA2 may be repeatedly disposed along the second direction DR2 on an entire surface of the display area DA. According to an embodiment, the first sub-emission area SEA1 and the second sub-emission area SEA2 may be alternately and repeatedly disposed along the second direction DR2. The pair of first and second sub-emission areas SEA1 and SEA2 may be disposed between the first emission area EA1 or the second emission area EA2 of two different unit pixels PX1, PX2, PX3, and PX4. The third emission area EA3 of the first unit pixel PX1 may be disposed between the first emission area EA1 and the second emission area EA2 of the first unit pixel PX1, and the first emission area EA1 of the second unit pixel PX2 and the second emission area EA2 of the first unit pixel PX1.

However, a disposition of the emission areas EA1, EA2, and EA3 is not necessarily limited to that illustrated in FIG. 5. Similar to the unit pixels PX1, PX2, PX3, and PX4, the emission areas EA1, EA2, and EA3 may be disposed in a Pentile™ type, e.g., a diamond Pentile™ type.

In addition, according to an embodiment, a position of the second emission area EA2 may be shifted to a first side with respect to the second color filter CF2, and in this case, an imaginary line connecting a center of the first light emission area EA1 and a center of the second emission area EA2 may form a predetermined angle with the second direction DR2. In addition, according to an embodiment, positions of the sub-emission areas SEA1 and SEA2 of the first emission area EA1 and the third emission area EA3 may be shifted based on the color filters CF1, CF2, and CF3, respectively, in addition to the second emission area EA2.

The first to third emission areas EA1, EA2, and EA3 may each be defined by the openings OPE1, OPE2, and OPE3 formed in the pixel defining layer PDL (FIG. 6) of the light emitting element layer EML. For example, the first emission area EA1 may be defined by the first opening OPE1 (in FIG. 6) of the pixel defining layer, the second emission area EA2 may be defined by the second opening OPE2 (in FIG. 6) of the pixel defining layer, and the third light emitting area EA3 may be defined by the third opening OPE3 (in FIG. 6) of the pixel defining layer.

In an embodiment, an area or size of the first to third emission areas EA1, EA2, and EA3 may be different from each other. In the embodiment of FIG. 5, an area of the first emission area EA1 is larger than that of each of the sub-emission areas SEA1 and SEA2 of the second emission area EA2 and the third emission area EA3, and an area of the second emission area EA2 may be larger than that of each of the sub-emission areas SEA1 and SEA2 of the third emission area EA3. The areas of the emission areas EA1, EA2, and EA3 may vary depending on sizes of the openings OPE1, OPE2, and OPE3 formed in the pixel defining layer PDL. Intensity of light emitted from the corresponding light emitting areas EA1, EA2, and EA3 may vary depending on an area of the light emitting areas EA1, EA2, and EA3, and color sense of a screen displayed on the emissive display device 10 or the electronic device 1 may be controlled by adjusting the areas of the emission areas EA1, EA2, and EA3. The areas of the emission areas EA1, EA2, and EA3 are related to light efficiency and lifespan of the light emitting diode ED, and may have a trade-off relationship with reflection by external light. The areas of the emission areas EA1, EA2, and EA3 may be adjusted in consideration of the above matters.

According to an embodiment, in the emissive display device 10, the areas of the emission areas EA1, EA2, and EA3 or areas of the openings OPE1, OPE2, and OPE3 of the pixel defining layer PDL may be designed such that reflected external light may be recognized as white mixed light.

The emissive display device 10 may include a plurality of color filters CF1, CF2, and CF3 disposed on light emission areas EA1, EA2, and EA3. The color filters CF1, CF2, and CF3 correspond to the light emitting areas EA1, EA2, and EA3 or the openings OPE1, OPE2, and OPE3. Each of the color filters CF1, CF2, and CF3 has an area larger than that of the openings OPE1, OPE2, and OPE3 of the pixel defining layer PDL. In FIG. 5, boundaries of adjacent color filters CF1, CF2, and CF3 are illustrated as straight lines, and in practice, the adjacent color filters CF1, CF2, and CF3 have overlapping portions at least partially overlapping each other with a predetermined width. Referring to FIG. 6, overlapping portions of the color filters CF1, CF2, and CF3 are formed at an increased height to form a step.

The light blocking layer BM is disposed below the color filters CF1, CF2, and CF3 in the third direction DR3. Referring to FIG. 5, the light blocking layer BM also has openings OPT1, OPT2, and OPT3.

The openings OPT1, OPT2, and OPT3 of the light blocking layer BM may overlap the openings OPE1, OPE2, and OPE3 of the pixel defining layer PDL corresponding to the emission areas EA1, EA2, and EA3, and may form a light output area from which light emitted from the emission areas EA1, EA2, and EA3 is outputted. Each of the color filters CF1, CF2, and CF3 may have a larger area than that of the openings OPT1, OPT2, OPT3 of the light blocking layer BM, and the openings OPE1, OPE2, and OPE3 of the pixel defining layer PDL, and each of the color filters CF1, CF2, and CF3 may completely cover the light output area.

The openings OPT1, OPT2, and OPT3 of the light blocking layer BM are formed with a larger area than the openings OPE1, OPE2, and OPE3 of the pixel defining layer PDL, and boundaries of the openings OPT1, OPT2, and OPT3 of the light blocking layer BM may be disposed outside the openings OPE1, OPE2, and OPE3 of the pixel defining layer PDL. Accordingly, the light blocking layer BM may be formed with a smaller area than the area of the pixel defining layer PDL, and a portion of the pixel defining layer PDL adjacent to the openings OPE1, OPE2, and OPE3 in a plan view is exposed by the openings OPT1, OPT2, and OPT3 of the light blocking layer BM.

Each of the color filters CF1, CF2, and CF3 may be disposed to correspond to the emission areas EA1, EA2, and EA3. The color filters CF1, CF2, and CF3 may include a first color filter CF1, a second color filter CF2, and a third color filter CF3 disposed to correspond to different emission areas EA1, EA2, and EA3. The color filters CF1, CF2, and CF3 may include a colorant such as a dye or pigment that absorbs light in a wavelength range other than a specific wavelength range, and may correspond to colors of light emitted from the emission areas EA1, EA2, and EA3. For example, the first color filter CF1 may be a red color filter that is disposed to overlap the first emission area EA1, and exclusively transmits first red light. The second color filter CF2 may be a green color filter that overlaps the second emission area EA2 and exclusively transmits green second light, and the third color filter CF3 may be a blue color filter that overlaps the sub-emission areas SEA1 and SEA2 of the third emission area EA3 and exclusively transmits blue third light.

Similar to the disposition of the emission areas EA1, EA2, and EA3, the color filters CF1, CF2, and CF3 may be disposed in the first direction DR1, the second direction DR2, or in a diagonal direction therebetween. For example, the first color filter CF1 and the second color filter CF2 are adjacent to each other in the second direction DR2. According to an embodiment, they may be alternately disposed in the second direction DR2 on an entire surface of the display area DA. The first color filter CF1 disposed in the third unit pixel PX3 may be disposed between the second color filter CF2 in the first unit pixel PX1 and the second color filter CF2 in the third unit pixel PX3. The third color filter CF3 may be disposed adjacent to the first color filter CF1 and the second color filter CF2 in the first direction DR1, and the third light emitting areas EA3 may be repeatedly disposed in the second direction DR2 on the entire surface of the display area DA. For example, the third color filter CF3 disposed in the first unit pixel PX1 may be disposed between the second color filter CF2 in the first unit pixel PX1 and the second color filter CF2 in the second unit pixel PX2.

Referring to FIG. 5, the emissive display device 10 may include a color pattern CP protruding from the first color filter CF1 in the first direction DR1 to contact the third color filter CF3 in the second direction DR2. The color pattern CP may include a same material as that of the first color filter CF1, and may be integrated with the first color filter CF1. The color pattern CP may include a same material as the first color filter CF1 to be disposed within each of unit pixels PX1, PX2, PX3, and PX4 in consideration of color sense of light reflected from the emissive display device 10. The color pattern CP may be adjacent to the third color filter CF3 in the second direction DR2, and in this case, positions where the color pattern CP is disposed for each of the unit pixels PX1, PX2, PX3, and PX4 may be different. For example, in the first unit pixel PX1 and the fourth unit pixel PX4, the color pattern CP may be disposed at an upper side of the third color filter CF3 in the second direction DR2, and in the second unit pixel PX2 and the third unit pixel PX3, the color pattern CP may be disposed at a lower side, which is a second side of the third color filter CF3 in the second direction DR2. The color pattern CP may be disposed over two adjacent unit pixels PX1, PX2, PX3, and PX4 in the second direction DR2. A plurality of color patterns CP may be spaced apart from each other in the second direction DR2 or in the diagonal direction on an entire surface of the display area DA.

According to an embodiment, the emissive display device 10 may have different areas of the emission areas EA1, EA2, and EA3, and may also have different areas of the color filters CF1, CF2, and CF3. The emission areas EA1, EA2, and EA3 may have areas in a specific ratio to each other, and similarly, the color filters CF1, CF2, and CF3 may have areas in a specific ratio. However, an area ratio between the emission areas EA1, EA2, and EA3 may be different from an area ratio between the color filters CF1, CF2, and CF3. A relative area ratio of the color filters CF1, CF2, and CF3 may affect color sense of reflected external light when external light is reflected on the emissive display device 10. In the emissive display device 10, the color filters CF1, CF2, and CF3 may have an area of a specific ratio, and the color sense of the external light may have a color that is comfortable for user eyes by including the color pattern CP containing a same material as that of the red color filter.

However, a disposition of the color filters CF1, CF2, and CF3 is not necessarily limited to that illustrated in FIG. 5. Similar to the disposition of emission areas EA1, EA2, and EA3, the color filters CF1, CF2, and CF3 may be disposed in a Pentile™ type, e.g., a diamond Pentile™ type. In addition, a disposition of a protruding portion of the first color filter CF1 may be different from that illustrated in FIG. 5.

A portion of the planar pixel defining layer PDL adjacent to the openings OPE1, OPE2, and OPE3 is exposed by the openings OPT1, OPT2, and OPT3 of the light blocking layer BM. The pixel defining layer PDL exposed by the openings OPT1, OPT2, and OPT3 of the light blocking layer BM forms the openings OPE1, OPE2, and OPE3, and a side surface of the pixel defining layer PDL having a curved shape is also exposed. As external light is reflected on a curved portion of the exposed side surface of the pixel defining layer PDL, a ring-shaped pattern (refer to the halo of FIG. 9 and FIG. 10 (A)) may be recognized. In the present embodiment, scattering particles (see SP in FIG. 6 or 7) are formed in the openings OPT1, OPT2, and OPT3 of the light blocking layer BM, and external light incident on the side surface of the pixel defining layer PDL exposed by the openings OPT1, OPT2, and OPT3 of the light blocking layer BM is scattered to reduce an amount of incident light, and the light reflected from the side surface is also scattered so that the ring-shaped halo is not visible from the outside.

Hereinafter, a cross-sectional structure of an emissive display device according to an embodiment will be described with reference to FIG. 6 and FIG. 7.

FIG. 6 and FIG. 7 each illustrate a schematic cross-sectional view of an emissive display device according to an embodiment.

FIG. 6 and FIG. 7 mainly illustrate the first emission area EA1 and the second emission area EA2 among the first emission area EA1, the second emission area EA2, and the third emission area EA3.

First, an embodiment of FIG. 6 will be described.

The emissive display device 10 may include a substrate SUB, a driving element layer TFTL, a light emitting element layer EML, an encapsulation layer TFEL, and an external light reducing layer CFL. The external light reducing layer CFL disposed on the encapsulation layer TFEL includes a light blocking layer BM and color filters CF1 and CF2, and a scattering layer SL including scattering particles SP disposed in a transparent layer SOL is formed. In the embodiment of FIG. 6, the scattering layer SL is disposed exclusively within the openings OPT1 and OPT2 of the light blocking layer BM. Herein, the substrate SUB, the driving element layer TFTL, the light emitting element layer EML, and the encapsulation layer TFEL of the emissive display device 10 may constitute a display layer (see DU in FIG. 33), and thus the emissive display device 10 may be divided into the display layer and the external light reducing layer CFL.

This will be described in detail through a cross-sectional structure of FIG. 6.

The substrate SUB may be a base substrate or a base member. The substrate SUB may be a flexible substrate capable of being bent, folded, or rolled to a noticeable extent without cracking or otherwise sustaining damage. For example, the substrate SUB may include a polymer resin such as polyimide (PI), but the present invention is not necessarily limited thereto. For example, the substrate SUB may include a glass material or a metal material.

The driving element layer TFTL may be disposed on the substrate, may include a transistor, and may include a plurality of insulating films and a plurality of conductive layers. A number and stack structure of transistors included in the driving element layer TFTL may vary.

The light emitting element layer EML may be disposed on the driving element layer TFTL.

The light emitting element layer EML may include a light emitting diode ED and a pixel defining layer PDL. The light emitting diode ED may include a pixel electrode AE (hereinafter also referred to as a first electrode or anode), an emission layer EL, and a common electrode CE (hereinafter referred to as a second electrode or cathode). The light emitting diode ED may additionally include a hole injection layer, a hole transport layer, an electron injection layer, and/or an electron transport layer, and may further include functional layers FL disposed at opposite sides of the emission layer EL.

The pixel defining layer PDL may include a plurality of openings OPE1 and OPE2, the openings OPE1 and OPE2 overlap a portion of the pixel electrode AE, and a pixel defining layer PDL may be disposed on a portion of the pixel electrode AE. Each of the openings OPE1 and OPE2 of the pixel defining layer PDL may define an emission area, and their areas or sizes may be different from each other. The pixel defining layer PDL may separate and insulate the pixel electrode AE of each of a plurality of light emitting diodes ED. The pixel defining layer PDL may be a black pixel defining layer including a light absorbing material to prevent reflection of external light. For example, the pixel defining layer PDL may include a polyimide (PI)-based binder and pigments in which red, green, and blue colors are mixed. Alternatively, the pixel defining layer PDL may include a cardo-based binder resin and a mixture of a lactam black pigment and a blue pigment. Alternatively, the pixel defining layer PDL may include a carbon black.

The encapsulation layer TFEL may be disposed on the common electrode CE to cover the light emitting diodes ED. The encapsulation layer TFEL may include at least one inorganic layer, to prevent oxygen or moisture from penetrating into the light emitting element layer EML. The encapsulation layer TFEL may include at least one organic film to protect the light emitting element layer EML from foreign particles such as dust.

The encapsulation layer TFEL in FIG. 6 may include a first encapsulation layer TFE1, a second encapsulation layer TFE2, and a third encapsulation layer TFE3. The first encapsulation layer TFE1 and the third encapsulation layer TFE3 may be inorganic encapsulation layers, and the second encapsulation layer TFE2 disposed therebetween may be an organic encapsulation layer.

The first encapsulation layer TFE1 and the third encapsulation layer TFE3 may each include at least one inorganic insulator. The inorganic insulator may include an aluminum oxide, a titanium oxide, a tantalum oxide, a hafnium oxide, a zinc oxide, a silicon oxide, a silicon nitride, and/or a silicon oxynitride.

The second encapsulation layer TFE2 may include a polymer-based material. The polymer-based material may include an acrylic resin, an epoxy resin, polyimide, and polyethylene. For example, the second encapsulation layer TFE2 may include an acrylic resin, e.g., poly(methyl methacrylate) or polyacrylic acid. The second encapsulation layer TFE2 may be formed by curing a monomer or applying a polymer.

The external light reducing layer CFL disposed on the encapsulation layer TFEL includes a light blocking layer BM, color filters CF1 and CF2, and a scattering layer SL.

For example, the light blocking layer BM may be disposed on the encapsulation layer TFEL. The light blocking layer BM may include a plurality of openings OPT1 and OPT2 overlapping the emission area. The first opening OPT1 overlap the first emission area or the first opening OPE1, and the second opening OPT2 may overlap the second emission area or the second opening OPE2. An area or size of each of the openings OPT1 and OPT2 may be larger than that of the openings OPE1 and OPE2 of the pixel defining layer PDL. As the openings OPT1 and OPT2 of the light blocking layer BM may be larger than the openings OPE1 and OPE2 of the pixel defining layer PDL, light emitted from the emission areas EA1, EA2, and EA3 may be viewed by a user not only from a front surface but also from a side surface of the emissive display device 10.

The light blocking layer BM may include a light absorbing material. For example, the light blocking layer BM may include an inorganic black pigment or an organic black pigment. The inorganic black pigment may be carbon black, and the organic black pigment may include lactam black, perylene black, and/or aniline black, but the present invention is not necessarily limited thereto. The light blocking layer BM may help color reproducibility of the emissive display device 10 by preventing visible light from penetrating between the emission areas and mixing colors.

The color filters CF1 and CF2 of the external light reducing layer CFL may be disposed on the light blocking layer BM. The different color filters CF1 and CF2 may be respectively disposed to correspond to the different emission areas, the openings OPE1 and OPE2 of the pixel defining layer PDL and the openings OPT1 and OPT2 of the light blocking layer BM. For example, the first color filter CF1 may correspond to the first emission area, and the second color filter CF2 may correspond to the second emission area. The first color filter CF1 may be disposed in the first opening OPT1 of the light blocking layer BM, and the second color filter CF2 may be disposed in the second opening OPT2 of the light blocking layer BM. Each of the color filters CF1 and CF2 may have a larger area in a plan view than the openings OPT1 and OPT2 of the lower light blocking layer BM, and some may be directly disposed on the light blocking layer BM. An overlapping portion where adjacent color filters CF1 and CF2 overlap may be disposed on the light blocking layer BM.

The scattering layer SL is disposed in each of the openings OPT1 and OPT2 of the light blocking layer BM. The scattering layer SL includes the scattering particles SP disposed in the transparent layer SOL, and fills each of the openings OPT1 and OPT2 of the light blocking layer BM. The scattering particles SP included in the scattering layer SL scatter external light to reduce the light provided to the side surface of the pixel defining layer PDL that is not covered by the openings OPT1 and OPT2 serves to scatter so that a ring-shaped pattern (halo) does not occur due to the light reflected from the side surface of the pixel defining layer PDL. The transparent layer SOL constituting the scattering layer SL may be a colorless light-transmitting layer that does not have a color in a visible light range. For example, the transparent layer SOL may include a colorless light-transmitting organic material such as an acryl-based resin. The scattering particles SP included in the scattering layer SL may include one of the scattering particles described in FIG. 13 to FIG. 15. The scattering layer SL may have characteristics of FIG. 8 to FIG. 12, which will be described later.

The external light reducing layer CFL may further include a planarization layer OC, and the planarization layer OC may be disposed on the color filters CF1 and CF2 to planarize upper ends of the color filters CF1 and CF2. The planarization layer OC may be a colorless light-transmitting layer that does not have a color in a visible light range. For example, the planarization layer OC may include a colorless light-transmitting organic material such as an acryl-based resin.

According to an embodiment, the scattering layer SL may have a structure as illustrated in FIG. 7.

Unlike FIG. 6, FIG. 7 is an embodiment in which the scattering layer SL is disposed at upper portions of the color filters CF1 and CF2, and is formed over an entire area.

Accordingly, the color filters CF1 and CF2 are disposed in the respective openings OPT1 and OPT2 of the light blocking layer BM.

A material and a characteristic of the scattering layer SL of the embodiment of FIG. 7 may be the same as those of FIG. 6, and hereinafter, the characteristic of the scattering layer SL and the emissive display device including the scattering layer SL will be described with reference to FIG. 8 to FIG. 12.

FIG. 8 to FIG. 12 illustrate views comparing comparative examples and examples.

In FIG. 8 to FIG. 12, an example described as "Scattering particle Exist" is an example having a structure not including the scattering layer SL in FIG. 6 or FIG. 7 as a comparative example.

Referring to FIG. 8, specular component included (SCI) and specular component excluded (SCE) are described in the comparative example, the embodiment of FIG. 6 and the embodiment of FIG. 7.

Referring to FIG. 8, it can be seen that although the SCE of the comparative example not including the scattering layer SL has the smallest value, the SCI, which is a sum of both diffuse reflection and specular reflection, has a smallest value in the example of FIG. 6. The embodiment of FIG. 7 has both the SCE and the SCI that are larger than those of the comparative example, so the embodiment of FIG. 6 may be applied except for special cases.

Figure 9:
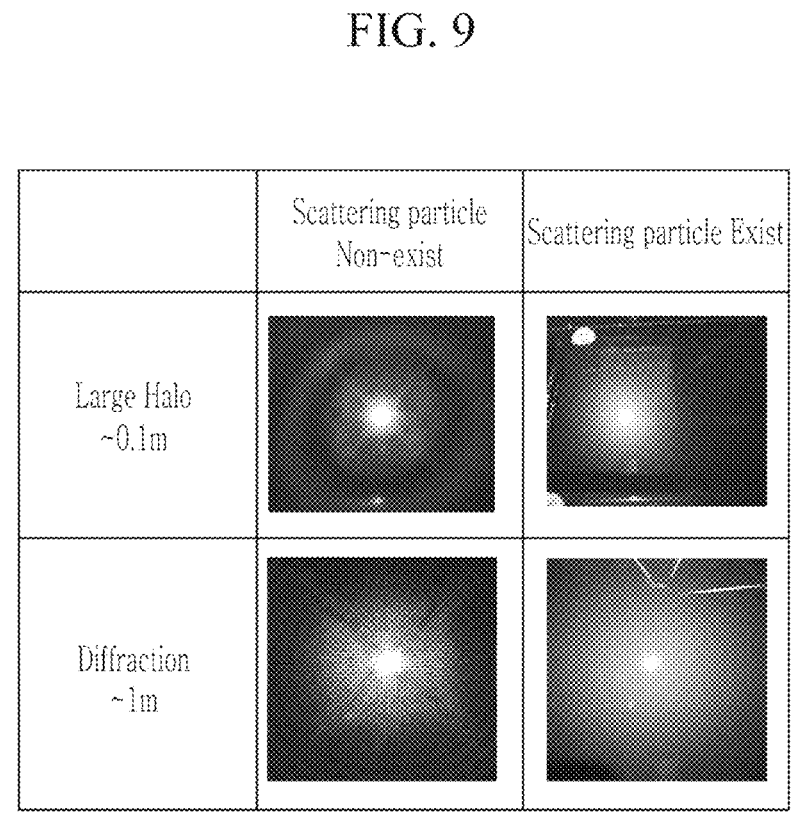

In FIG. 9, "Scattering particle Non-exist" indicates the embodiment of FIG. 6, and it includes pictures of reflected light in the comparative example and the embodiment of FIG. 6.

In FIG. 9, there are largely two types of pictures taken, a first one is a picture taken with external light provided within 1 m, and a second one is a picture taken with external light provided within 10 cm. The photo taken at 1 m shows the characteristics of external light being reflected and diffracted, and the photo taken at 10 cm shows a size and intensity of a halo generated around strong light. In particular, in the comparative example (Scattering particle Exist), halo is clearly visible.

In contrast, in the comparative example, the ring-shaped halo is not visually recognized.

Figure 10:
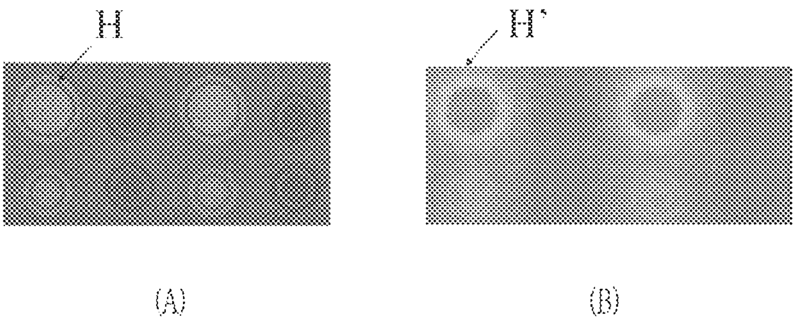

This characteristic may also be confirmed in FIG. 10. In FIG. 10A, an arrow points to the halo, and referring to FIG. 10B, it can be seen that the halo is removed or weakened by the scattering layer SL including the scattering particles SP.

Figure 12:
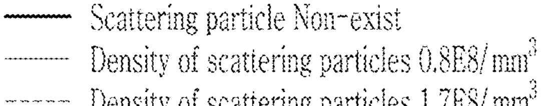
Figure 12:
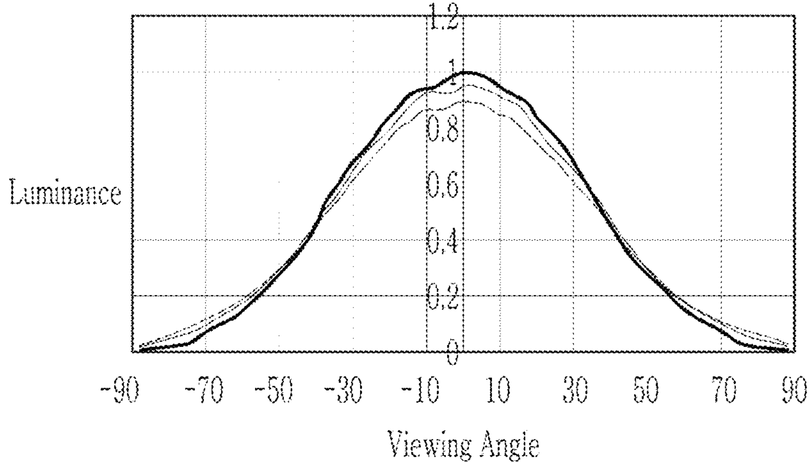

FIG. 11 and FIG. 12 show luminance characteristics according to viewing angles.

Referring to FIG. 11 and FIG. 12, it can be seen that frontal luminance of the example is lower than that of the comparative example, but side luminance at a side surface of 45 degree is high. An angle of light provided to a front surface is bent and provided to a side surface by the scattering particles SP included in the scattering layer SL, frontal luminance is reduced and lateral luminance is increased.

In particular, referring to FIG. 12, it can be seen that luminance according to a viewing angle is different according to density of the scattering particles SP.

Hereinafter, types and characteristics of the scattering particles SP that can be used will be described with reference to FIG. 13 to FIG. 15.

FIG. 13 to FIG. 15 illustrate characteristics of scattering particles according to embodiments.

The scattering particles SP included in the scattering layer SL may include one of the scattering particles described in FIG. 13 to FIG. 15.

First, referring to FIG. 13, the scattering particles SP may include a titanium oxide ($TiO_2$), a zirconium oxide ($Zr_2O_3$), an aluminum oxide ($Al_2O_3$), a silicon oxide ($SiO_2$), hollow silica, an acrylate-based material, and/or a silicon-based material. Herein, the hollow silica may have a structure in which an inside of a particle of silicon dioxide ($SiO_2$) having a three-dimensional shape such as a sphere has an empty space.

An example of the scattering particles SP illustrated in FIG. 13 may be classified into three types according to used particle density (ea/mm$^3$). Herein, the particle density is a number per unit volume of the scattering particles SP in the transparent layer SOL of the scattering layer SL.

The first type of scattering particles SP may have a value of 1 ea/mm$^3$ or more and 10 ea/mm$^3$ or less, and in this case, the scattering particles SP may include a titanium may include a titanium oxide ($TiO_2$), and a diameter of the titanium oxide ($TiO_2$) used may be 0.1 μm or more and 1.5 μm or less.

The second type of scattering particles SP may have a value of 2 ea/mm$^3$ or more and 20 ea/mm$^3$ or less, and in this case, the scattering particles SP may include a zirconium oxide ($Zr_2O_3$), an aluminum oxide ($Al_2O_3$), a silicon oxide ($SiO_2$), or hollow silica, and the used zirconium oxide ($Zr_2O_3$), aluminum oxide ($Al_2O_3$), silicon oxide ($SiO_2$), and/or hollow silica may have a diameter of 0.1 μm or more and 1.5 μm or less.

The third type of scattering particles SP may have a value of 3 ea/mm$^3$ or more and 30 ea/mm$^3$ or less, and in this case, the scattering particles SP may include an acrylate-based material and/or a silicon-based material, and a diameter of the acrylate-based material or the silicon-based material used may be 0.2 μm or more and 5.0 μm or less.

In detail, the diameter, volume, volume ratio, weight ratio, and density of each of the three types of scattering particles described in FIG. 13 are shown in Table 1 below.

TABLE 1

| Scattering particle Type | Diameter (μm) | Volume μm$^3$ | Particle density (ea/mm$^3$) | Volume ratio (Vol %) | Weight ratio (wt %) | 2D density (ea/mm$^2$) |
|---|---|---|---|---|---|---|
| $TiO_2$ | 0.1 | 0.000523333 | 5.70E+09 | 0.30% | 1% | 3.19E+06 |
| | 0.1 | 0.000523333 | 5.90E+10 | 3.09% | 10% | 1.52E+07 |
| | 1.5 | 1.76625 | 1.70E+06 | 0.30% | 1% | 1.42E+04 |
| | 1.5 | 1.76625 | 1.74E+07 | 3.07% | 10% | 6.71E+04 |
| $ZrO_3$ | 0.1 | 0.000523333 | 1.00E+10 | 0.52% | 2% | 4.64E+06 |
| | 0.1 | 0.000523333 | 9.40E+10 | 4.92% | 20% | 2.07E+07 |
| | 1.5 | 1.76625 | 1.90E+06 | 0.34% | 2% | 1.53E+04 |
| | 1.5 | 1.76625 | 2.82E+07 | 4.98% | 20% | 9.26E+04 |
| $Al_2O_3$ | 0.1 | 0.000523333 | 1.15E+10 | 0.60% | 2% | 5.09E+06 |
| | 0.1 | 0.000523333 | 1.60E+11 | 8.37% | 20% | 2.95E+07 |

TABLE 1-continued

| Scattering particle Type | Diameter (μm) | Volume μm$^3$ | Particle density (ea/mm$^3$) | Volume ratio (Vol %) | Weight ratio (wt %) | 2D density (ea/mm$^2$) |
|---|---|---|---|---|---|---|
| | 1.5 | 1.76625 | 3.40E+06 | 0.60% | 2% | 2.26E+04 |
| | 1.5 | 1.76625 | 4.90E+07 | 8.65% | 20% | 1.34E+05 |
| | 0.1 | 0.000523333 | 2.00E+10 | 1.05% | 2% | 7.37E+06 |
| | 0.1 | 0.000523333 | 2.30E+11 | 12.04% | 20% | 3.75E+07 |
| | 1.5 | 1.76625 | 5.00E+06 | 0.88% | 2% | 2.92E+04 |
| | 1.5 | 1.76625 | 6.80E+07 | 12.01% | 20% | 1.67E+05 |
| Acrylate type | 0.2 | 0.004186667 | 6.00E+09 | 2.51% | 3% | 3.30E+06 |
| | 0.2 | 0.004186667 | 7.20E+10 | 30.14% | 30% | 1.73E+07 |
| | 5 | 65.41666667 | 5.00E+05 | 3.27% | 3% | 6.30E+03 |
| | 5 | 65.41666667 | 4.60E+06 | 30.09% | 30% | 2.77E+04 |
| Silicone type | 0.2 | 0.004186667 | 7.00E+09 | 2.93% | 3% | 3.66E+06 |
| | 0.2 | 0.004186667 | 7.20E+10 | 30.14% | 30% | 1.73E+07 |
| | 5 | 65.41666667 | 5.00E+05 | 3.27% | 3% | 6.30E+03 |
| | 5 | 65.41666667 | 4.60E+06 | 30.09% | 30% | 2.77E+04 |

Table 1 includes simulation results of volume ratio, weight ratio, particle density (also referred to as 3D density), which is the number of particles per unit volume, and 2D density, which is the number of particles per unit area, based on the diameter and volume of each scattering particle.

Based on Table 1, the scattering particles SP of the first class may additionally have a volume ratio (vol %) of 1.7E+06 or more and 5.9E+10 or less, and a weight ratio (weight percent (wt %)) of 0.3% or more and 3.09% or less, and the 2D density may have a density of 1.42E+04 or more and 1.52E+07 or less.

Among the second type of scattering particles SP, zirconium ($Zr_2O_3$) may additionally have a volume ratio (vol %) of 1.9E+06 or more and 9.4E+10 or less, it may have a weight ratio (weight percent (wt %)) of 0.34% or more and 4.98% or less, and the 2D density may have density of 1.53E+04 or more and 2.07E+07 or less.

Among the second type of scattering particles SP, aluminum oxide ($Al_2O_3$) may additionally have a volume ratio (vol %) of 3.4E+06 or more and 2.3E+11 or less, it may have a weight ratio (weight percent (wt %)) of 0.6% or more and 12.04% or less, and the 2D density may be 2.26E+04 or more and 3.75E+07 or less.

Among the third type of scattering particles SP, the acrylate-based material may additionally have a volume ratio (vol %) of 5.0E+05 or more and 7.2E+10 or less, it may have a weight ratio (weight percent (wt %)) of 2.51% or more and 30.14% or less, and the 2D density may be 6.03E+03 or more and 1.73E+07 or less.

Among the third type of scattering particles SP, the silicon-based material may additionally have a volume ratio (vol %) of 5.0E+05 or more and 7.2E+10 or less, it may have a weight ratio (weight percent (wt %)) of 2.93% or more and 30.14% or less, and the 2D density may be 6.03E+03 or more and 1.73E+07 or less.

Among the above three types of scattering particles SP, the titanium oxide ($TiO_2$) will be described in more detail with reference to FIG. 14 and FIG. 15.

In FIG. 14, when the titanium oxide ($TiO_2$) is used as the scattering particles SP, characteristics such as luminance ratio and reflectance are described, and based on this, the characteristics of the titanium oxide ($TiO_2$) that can be used in an embodiment are illustrated in FIG. 15.

First, referring to FIG. 14, light efficiency, luminance ratio, and reflectance of a comparative example (Scattering particle Non-exist) are described. In addition, light efficiency, luminance ratio, and reflectance of the emissive display device including titanium oxides ($TiO_2$) respectively having diameters of 220 nm, 300 nm, and 400 nm are also described. Herein, a haze value of the scattering layer SL including each of the titanium oxides ($TiO_2$) is also described, and the haze value has a value that increases as particle density of the titanium oxide ($TiO_2$) increases.

Referring to FIG. 14, it can be seen that the light efficiency in a front surface is reduced in the example compared to the comparative example, but the luminance ratio in a side surface (45 degrees and 60 degrees) is increased. In addition, it can be seen that the SCI of each example has a lower value than that of the comparative example, so that disadvantages caused by reflection of external light may be reduced.

In addition, when the haze value is also 80%, it is difficult to adopt because the light efficiency is too low, and a particle density range of titanium oxide ($TiO_2$) may be determined and used based on a range of haze value of 20% or more and 50% or less. For example, when the particle density of the titanium oxide ($TiO_2$) used in the embodiment is too high, the light efficiency may be too low, so only a certain range of particle densities may be used, and the characteristics of titanium oxide ($TiO_2$) used in an embodiment according to results of FIG. 14 are illustrated in FIG. 15.

Referring to FIG. 15, the titanium oxide ($TiO_2$) may have a particle density of 3 or more and 10 or less, and may have a particle density of 3 or more and 8 or less according to an embodiment. In this case, the titanium oxide ($TiO_2$) may have a diameter of 0.2 μm or more and 0.6 μm or less. A thickness of the scattering layer SL including titanium oxide ($TiO_2$) as the scattering particles SP may be greater than or equal to 1 μm and less than or equal to 3 μm. In this case, the scattering layer SL may fill each of the openings OPT1, OPT2, and OPT3 of the light blocking layer BM to a certain level or more to prevent the ring-shaped halo from being viewed.

When hollow silica is used as the scattering particles SP, it shows similar characteristics to the example using the titanium oxide ($TiO_2$), and the hollow silica may include the same numerical range as the numerical range of FIG. 15. For example, according to an embodiment, a particle density value of the hollow silica has a value of 3 or more and 8 ea/mm$^3$ or less, a diameter of the hollow silica is 0.2 μm or more and 0.6 μm or less, and a thickness of the scattering layer SL including hollow silica as the scattering particles SP may be greater than or equal to 1 μm and less than or equal to 3 μm.

In the foregoing, embodiments of the scattering layer SL including the scattering particles SP have been mainly described. Hereinafter, embodiments of the scattering layer SL including scattering patterns OPs will be described with reference to FIG. 16 to FIG. 31.

First, a planar structure of an emissive display device including the scattering patterns OPs will be described with reference to FIG. 16.

Figure 16:
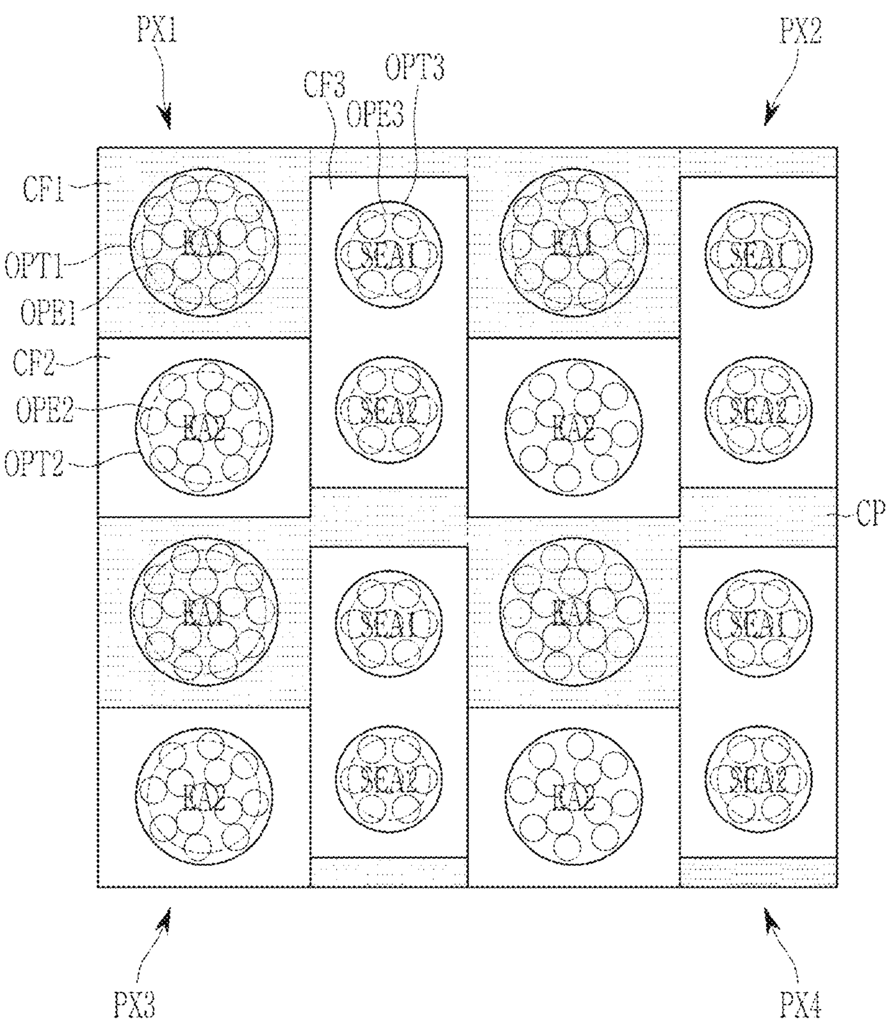
FIG. 16 is an enlarged plan view showing a portion of a rear surface of an emissive display device according to an embodiment.
Figure 16:
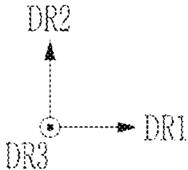

FIG. 16 is an enlarged plan view showing a portion of a rear surface of an emissive display device according to an embodiment.

Unlike in FIG. 5, in FIG. 16, the scattering patterns OPs are additionally illustrated. The scattering patterns OPs are larger in size than the scattering particles SP, and can be viewed in a plan view, and are illustrated in FIG. 16, which is a plan view. A size and number of scattering patterns OPs illustrated in FIG. 16 are merely examples and may be variously changed, and a larger number of scattering patterns OPs may be included.

An embodiment of FIG. 16 will be described as follows, focusing on different parts from the embodiment of FIG. 5.

A plurality of scattering patterns OPs are formed in an area overlapping each of the openings OPT1, OPT2, and OPT3 of the light blocking layer, and the scattering patterns OPs overlap the openings OPE1, OPE2, and OPE3 of the pixel defining layer and also overlap the emission areas EA1, EA2, and EA3 in a plan view. For example, the scattering patterns OPs are located inside the openings OPT1, OPT2, and OPT3 of the light blocking layer and outside the openings OPE1, OPE2, and OPE3 of the pixel defining layer in a plan view. As a result, external light incident on the side surface of the pixel defining layer having a curved surface is scattered to reduce an amount of incident light, and light reflected from the side of the pixel defining layer is also scattered to prevent ring-shaped halo from being viewed from the outside.

FIG. 16 illustrates an embodiment in which all scattering patterns OPs have the same size, but the scattering patterns OPs having different sizes may be formed for each the openings OPT1, OPT2, and OPT3 of the light blocking layer. In addition, the scattering patterns OPs may be disposed at regular intervals or randomly within the openings OPT1, OPT2, and OPT3 of the light blocking layer. Various planar arrangements of the scattering patterns OPs are described in FIG. 24.

Since these scattering patterns OPs need only be disposed at an upper portion of the light emitting device in the third direction DR3, they may be formed at various positions according to an embodiment. In addition, a material filling the inside of the scattering patterns OPs and a material forming the scattering layer SL on the outside may include various materials such as organic materials or inorganic materials. Some of various embodiments of the scattering patterns OPs will be described through cross-sectional views of FIG. 17 to FIG. 20.

FIG. 17 to FIG. 20 each illustrate a schematic cross-sectional view of an emissive display device according to an embodiment.

The embodiment of FIG. 17 to FIG. 20 are similar to that of FIG. 6, and to the extent that an element has not been described in detail with respect to FIGS. 17 to 20, it may be understood that the elements are at least similar to corresponding elements that have been described elsewhere within the present disclosure.

Figure 17:
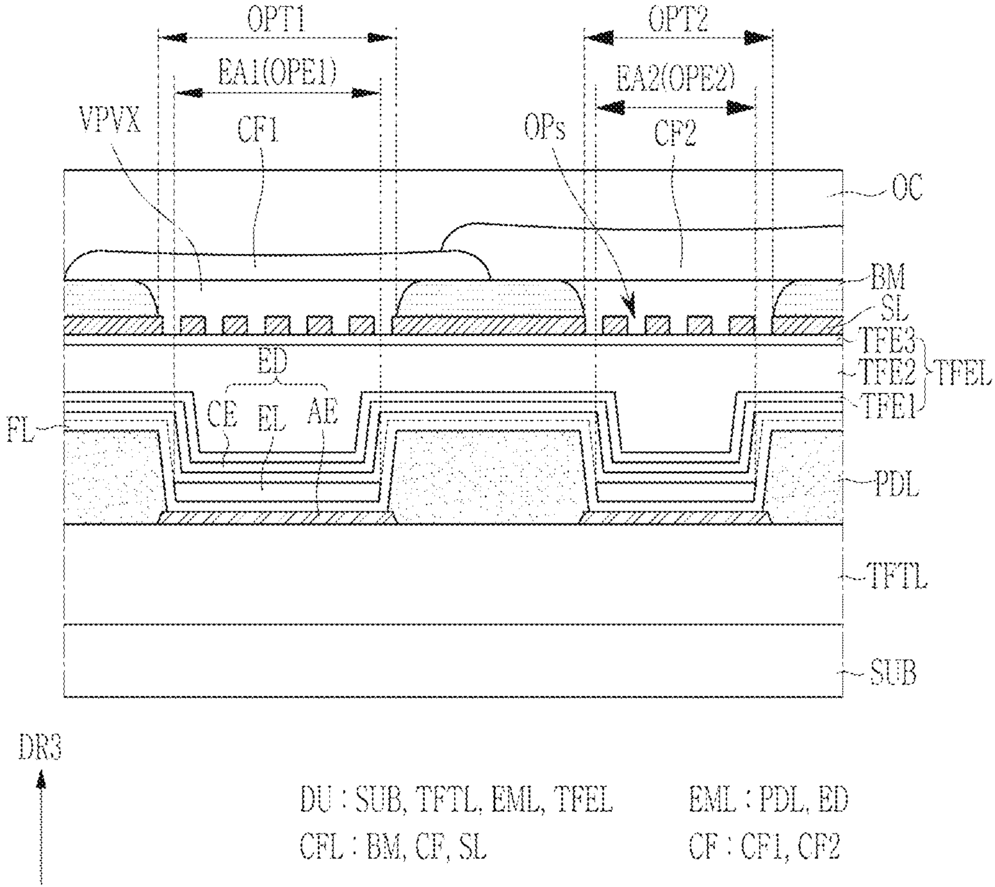
FIG. 17 to FIG. 20 are schematic cross-sectional views of an emissive display device according to an embodiment.

First, in the embodiment of FIG. 17, the scattering layer SL is disposed under the light blocking layer BM and the color filters CF1 and CF2, and a separate transparent organic portion (VPVX) is disposed within the scattering patterns OPs.

For example, the scattering layer SL is disposed on the encapsulation layer TFEL of FIG. 17 in the third direction DR3.

The scattering layer SL has a plurality of scattering patterns OPs, and some of the scattering patterns OPs may overlap openings OPE1 and OPE2 of the pixel defining layer PDL.

In the third direction DR3, on the scattering layer SL, a light blocking layer BM having 36 openings OPT1 and OPT2 and a transparent organic portion VPVX disposed within the openings OPT1 and OPT2 are disposed. Herein, the transparent organic portion VPVX may fill the scattering patterns OPs of the scattering layer SL, the scattering layer SL may include a transparent inorganic insulating layer, and the scattering layer SL may include an aluminum oxide, a titanium oxide, a tantalum oxide, a hafnium oxide, a zinc oxide, a silicon oxide, a silicon nitride, and/or a silicon oxynitride. The transparent organic portion VPVX may include an organic insulating layer, and may include a polyimide a polyamide, an acrylic resin, a benzocyclobutene, and/or a phenol resin. According to an embodiment, the transparent organic portion VPVX may have a refractive index that is smaller than that of the scattering layer SL or a lower layer, i.e., a third encapsulation layer TFE3, which is an upper layer of the encapsulation layer TFEL in FIG. 17.

All of the scattering patterns OPs may be disposed within the openings OPT1 and OPT2 of the light blocking layer BM. However, according to an embodiment, the scattering patterns OPs may be covered with the light blocking layer BM, and the light blocking layer BM may be disposed in the scattering patterns OPs. However, since the light blocking layer BM blocks light, the scattering patterns OPs are not optically affected, so it may have the same effect as the embodiment in which all the scattering patterns OPs are disposed within the openings OPT1 and OPT2 of the light blocking layer BM.

In FIG. 17, the scattering patterns OPs have a structure extending through the scattering layer SL. However, according to an embodiment, the scattering patterns OPs may have a concavo-convex structure on a surface of the scattering layer SL without extending through the scattering layer SL.

Color filters CF1 and CF2 may be disposed on the transparent organic portion VPVX and the light blocking layer BM, and a planarization layer OC may be disposed on the color filters CF1 and CF2.

According to an embodiment, the scattering layer SL may be configured by forming the scattering patterns OPs on the third encapsulation layer TFE3 which is an upper layer of the encapsulation layer TFEL without separately forming the scattering layer SL. For example, the third encapsulation layer TFE3 and the scattering layer SL may be a single integral structure, and at this time, the scattering patterns OPs may be disposed in the third encapsulation layer TFE3. In addition, according to an embodiment, a sensing electrode capable of sensing a touch and a sensing insulating film disposed between sensing electrodes may be formed between the encapsulation layer TFEL and the light blocking layer BM. In this embodiment, the scattering layer SL is formed separately, or may be formed by forming scattering patterns OPs on one of the sensing insulating layers. According to an embodiment, the scattering layer SL may include an organic layer including an organic material.

Figure 18:
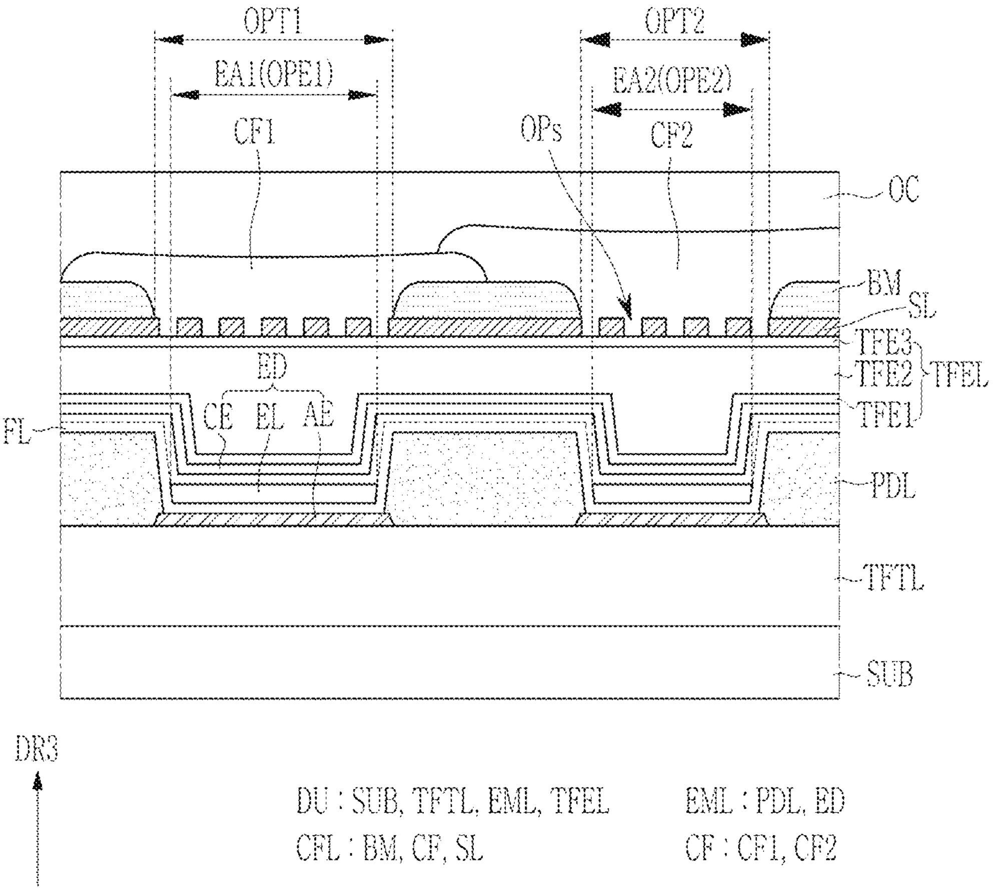

Unlike in FIG. 17, the embodiment of FIG. 18 does not include a separate transparent organic portion VPVX. As a result, the color filters CF1 and CF2 are disposed in the plurality of scattering patterns OPs of the scattering layer SL.

According to an embodiment, the color filters CF1 and CF2 may have a refractive index that is smaller than the refractive index of the scattering layer SL or a lower layer (the third encapsulation layer TFE3 in FIG. 18).

The embodiment of FIG. 18 may also be modified into a following embodiment.

In FIG. 18, the scattering patterns OPs have a structure extending through the scattering layer SL. However, according to an embodiment, the scattering patterns OPs may have a concavo-convex structure on a surface of the scattering layer SL without extending through the scattering layer SL.

According to an embodiment, the scattering layer SL may be configured by forming the scattering patterns OPs on the third encapsulation layer TFE3 which is an upper layer of the encapsulation layer TFEL without separately forming the scattering layer SL. For example, the third encapsulation layer TFE3 and the scattering layer SL may be a single integral structure, and at this time, the scattering patterns OPs may be disposed in the third encapsulation layer TFE3. In addition, according to an embodiment, a sensing electrode capable of sensing a touch and a sensing insulating film disposed between sensing electrodes may be formed between the encapsulation layer TFEL and the light blocking layer BM. In this embodiment, the scattering layer SL is formed separately, or may be formed by forming scattering patterns OPs on one of the sensing insulating layers. According to an embodiment, the scattering layer SL may include an organic layer including an organic material.

Figure 19:
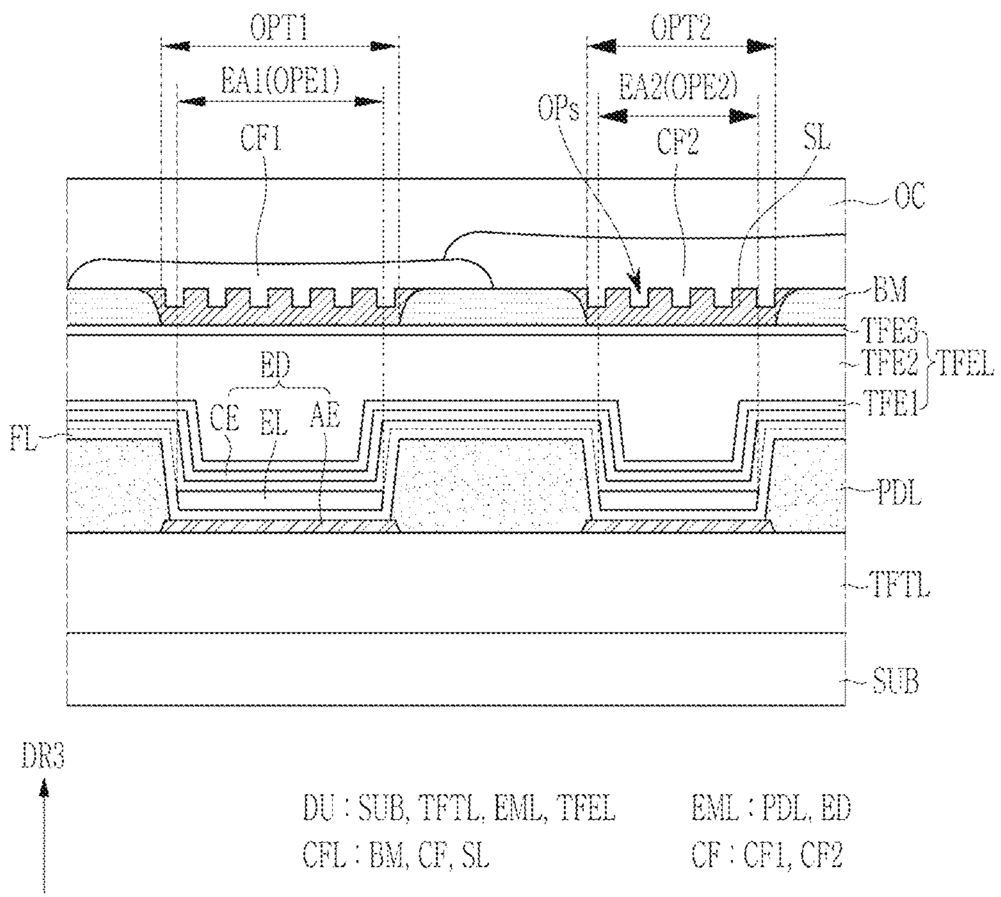

In the embodiment of FIG. 19, unlike in FIG. 17, the scattering layer SL might not be formed on an entire area, and may be disposed within the openings OPT1 and OPT2 of the light blocking layer BM. Herein, the scattering layer SL may include a transparent organic insulating material, and may have a concavo-convex structure on an upper surface. The scattering layer SL may include a polyimide, a polyamide, an acrylic resin, a benzocyclobutene, and/or a phenol resin.

According to an embodiment, the scattering layer SL may have a higher refractive index than that of the color filters CF1 and CF2 disposed at upper portions.

In FIG. 19, the scattering patterns OPs do not extend through the scattering layer SL, so that an upper surface of the scattering layer SL has a concavo-convex structure. The color filters CF1 and CF2 disposed at the upper portions are disposed within the scattering patterns OPs of the scattering layer SL having a concavo-convex structure.

The embodiment of FIG. 19 may also be modified into a following embodiment.

The scattering patterns OPs disposed on the scattering layer SL may have a structure extending through the scattering layer SL.

According to an embodiment, the scattering layer SL may include a transparent inorganic organic layer including an inorganic material.

Figure 20:
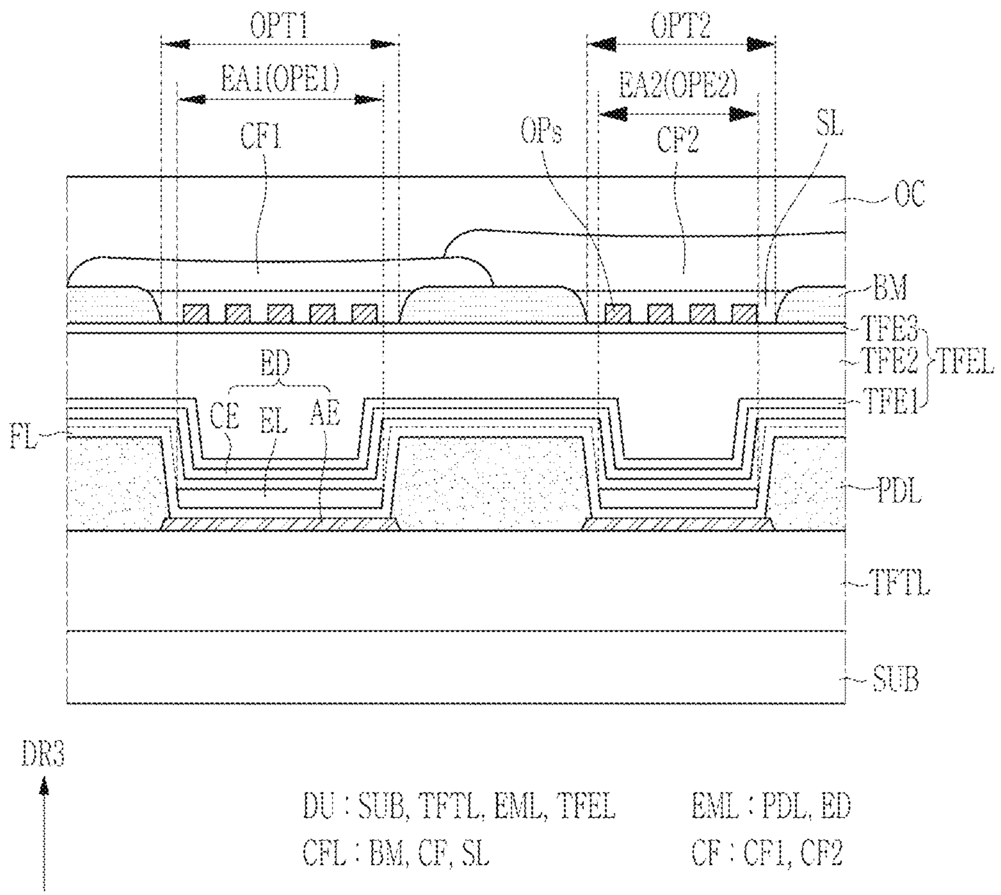

In the embodiment of FIG. 20, as in FIG. 19, the scattering layer SL might not be formed on an entire area, and may be disposed within the openings OPT1 and OPT2 of the light blocking layer BM.

In the embodiment of FIG. 20, the scattering patterns OPs are disposed in the openings OPT1 and OPT2 of the light blocking layer BM, and are disposed at a lower portion of the scattering layer SL. In addition, in the embodiment of FIG. 20, the scattering patterns OPs include a separate material, having no structure in which adjacent layers fill an inside of the scattering patterns OPs. For example, after the scattering patterns OPs are formed, the scattering layer SL covers them. Herein, the scattering layer SL may include a transparent organic insulating material, and may include a polyimide, a polyamide, an acrylic resin, benzocyclobutene, and/or a phenol resin. A material constituting the scattering patterns OPs may include a transparent organic material or an inorganic material, and may include a different material from a material constituting the scattering layer SL. The refractive indices of the scattering layer SL and the scattering patterns OPs are different from each other so that light can be scattered.

According to an embodiment, the scattering patterns OPs extend through the scattering layer SL. According to an embodiment, the scattering layer SL may include a transparent inorganic organic layer including an inorganic material.

According to an embodiment, the scattering layer SL and the scattering patterns OPs of FIG. 20 may be formed together in a phase separation manner having portions with different refractive indices. Such a phase separation method will be described in detail with reference to FIG. 21 to FIG. 23.

Figure 21:
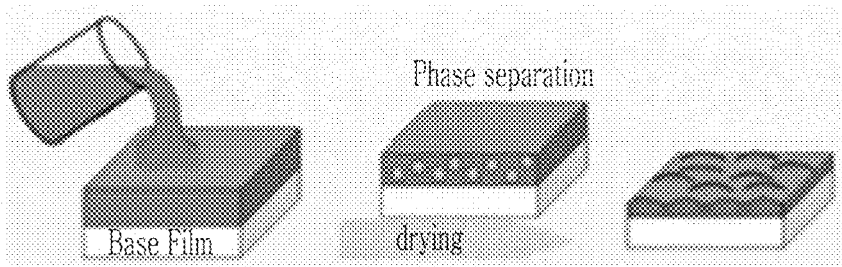
FIG. 21 to FIG. 23 are diagrams showing characteristics of a phase separation process and a phase separation pattern formed thereby.
Figure 22:
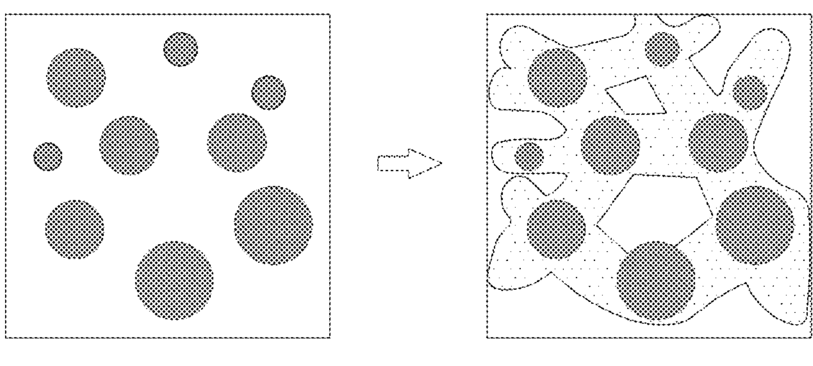
Figure 23:
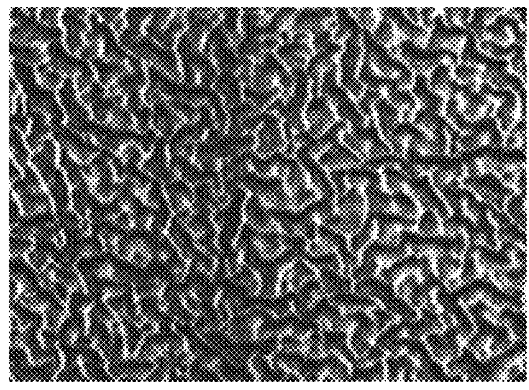

FIG. 21 to FIG. 23 illustrate characteristics of a phase separation process and a phase separation pattern formed thereby.

First, FIG. 21 illustrates a progress sequence of the phase separation process, and FIG. 22 illustrates how the structure may be changed through the phase separation process. In addition, FIG. 23 illustrates a photograph of a representation of a layer subjected to the phase separation process.

First, the progress sequence of the phase separation process will be described with reference to FIG. 21.

Referring to FIG. 21, after providing a phase separation solution on a base film, when the drying process may be carried out by heat, phase separation may proceed, and a surface of a phase-separated layer may have a curve.

Referring to FIG. 22, according to the phase separation process, portions having a droplet shape are phase-separated to be woven together to change into a net structure. As a result, a structure in which the surface of the phase-separated layer has a random pattern and is linearly connected may be formed as illustrated in FIG. 23. For example, according to the phase separation, since a portion having a different refractive index is included, scattering occurs when light passes, and thus the scattering layer SL of the present embodiment may be replaced.

Hereinafter, structures of various embodiments in which the scattering patterns OPs may be disposed in the opening OPT of the light blocking layer BM in a plan view will be described with reference to FIG. 24.

Figure 24:
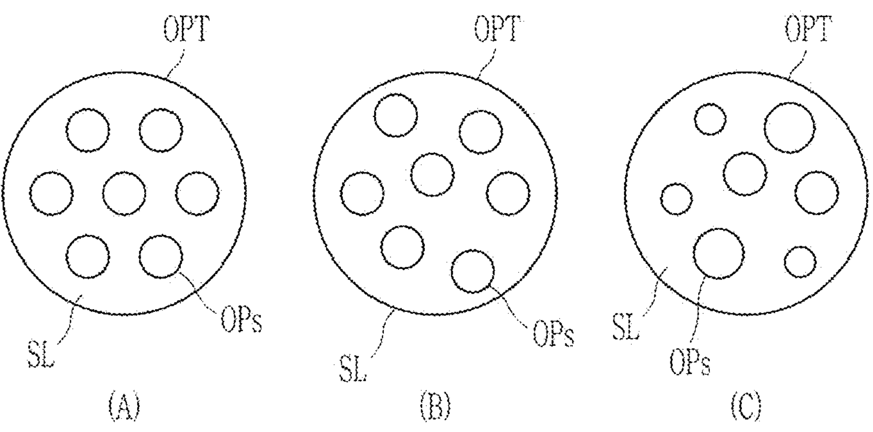
FIG. 24 is a diagram conceptually illustrating a planar structure of a scattering pattern according to various embodiments.

FIG. 24 conceptually illustrates a planar structure of a scattering pattern according to various embodiments.

As illustrated in FIG. 16, FIG. 24 illustrates an embodiment in which the scattering patterns OP have a constant size and are formed at regular intervals in the opening OPT of the light blocking layer. In this case, the scattering patterns OPs may also overlap the opening of the pixel defining layer, and might not overlap the opening of the pixel defining layer, but the scattering patterns OPs may also be disposed in a portion overlapping the opening OPT of the light blocking layer. As a result, external light incident on the side surface of the pixel defining layer having a curved surface is scattered to reduce an amount of incident light, and light reflected from the side of the pixel defining layer is also scattered to prevent ring-shaped halo from being viewed from the outside.

In the embodiment of FIG. 24 (B), the scattering patterns OPs have a constant size as in FIG. 24 (A), but this is an embodiment in which the scattering patterns OPs are irregularly arranged. In this case, the scattering patterns OPs may also overlap the opening of the pixel defining layer, and might not overlap the opening of the pixel defining layer, but the scattering patterns OPs may also be disposed in a portion overlapping the opening OPT of the light blocking layer. As a result, external light incident on the side surface of the pixel defining layer having a curved surface is scattered to reduce an amount of incident light, and light reflected from the side of the pixel defining layer is also scattered to prevent ring-shaped halo from being viewed from the outside.

In the embodiment of FIG. 24C, at least two of the scattering patterns OPs have different diameters or different sizes. In this case, in the embodiment of FIG. 24C, the scattering patterns OPs are irregularly disposed. In this case, the scattering patterns OPs may also overlap the opening of the pixel defining layer, and might not overlap the opening of the pixel defining layer, but the scattering patterns OPs may also be disposed in a portion overlapping the opening OPT of the light blocking layer. As a result, external light incident on the side surface of the pixel defining layer having a curved surface is scattered to reduce an amount of incident light, and light reflected from the side of the pixel defining layer is also scattered to prevent a ring-shaped halo from being viewed from the outside.

FIG. 24 illustrates a planar structure according to an embodiment, to which various deformable structures may be applied. For example, each of the scattering patterns OPs has a circular planar structure, but may have various shapes, such as a square, or may have a chamfered corner structure.

Hereinafter, characteristics of the emissive display device including the scattering patterns OPs will be described with reference to FIG. 25 to FIG. 30.

FIG. 25 to FIG. 30 illustrate differences according to characteristics of scattering patterns.

Figure 25:
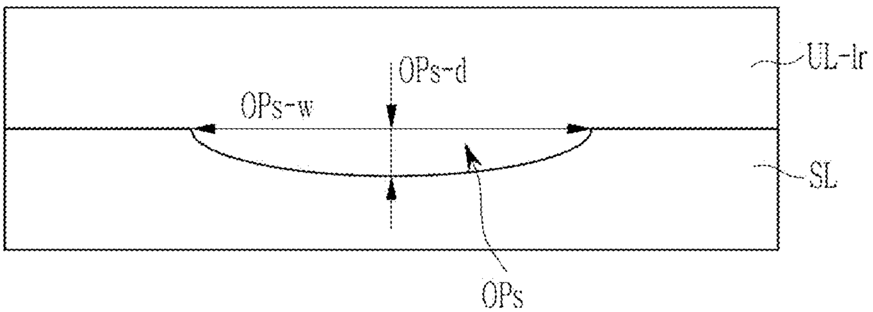

First, a width and depth to be used in FIG. 26 to FIG. 30 are defined through a cross-sectional structure of one scattering pattern OPs with reference to FIG. 25.

FIG. 25 illustrates the scattering patterns OPs having a structure that does not extend through the scattering layer SL. Referring to FIG. 25, a width OPs-w of the scattering pattern OPs has a greatest value among horizontal intervals between opposite ends of the cross-sectional view. A depth OPs-d of the scattering pattern OPs has a greatest value among vertical depths in the horizontal extension line of an upper surface of the scattering layer SL in a cross-sectional view.

In FIG. 25, an upper insulating layer UL-Ir disposed on top of the scattering layer SL to be disposed within the scattering patterns OPs is also illustrated, and the upper insulating layer UL-Ir may be one of various components of the emissive display device, or may be an organic layer or an inorganic layer. Herein, a refractive index of the upper insulating layer UL-Ir may be smaller than that of the scattering layer SL.

Figure 26:
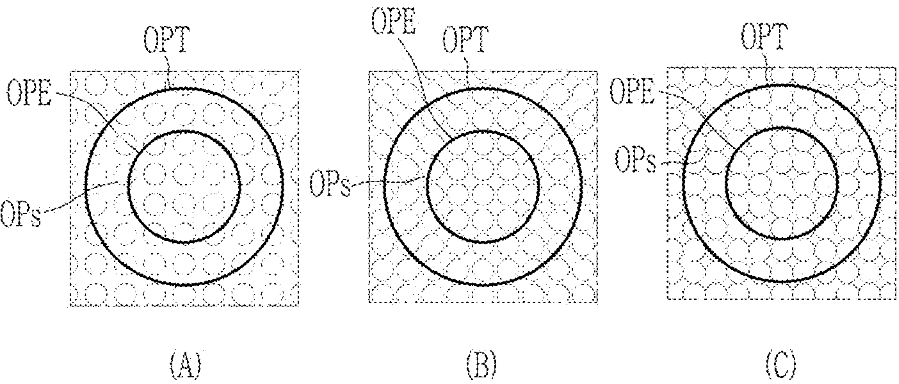

FIG. 26 illustrates the scattering patterns OPs at various intervals in order to define concept of a pattern area ratio.

In FIGS. 26A, 26B, and 26C, an opening OPE of the pixel defining layer and an opening OPT of a light blocking layer are illustrated, and scattering patterns OPs having a same size are illustrated at various intervals therein.

In FIG. 26A, the scattering patterns OPs are arranged at wider intervals than in FIGS. 26B and 26C, and in FIG. 26B, the scattering patterns OPs are arranged at wider intervals than in FIG. 26C.

In this structure, the pattern area ratio is defined as an area ratio occupied by the scattering patterns OPs in an area of the opening OPT of the light blocking layer. According to an embodiment, when the scattering patterns OPs are disposed exclusively in a certain area within the opening OPT of the light blocking layer (refer to the embodiment of FIG. 31), the pattern area ratio may be defined as an area ratio occupied by the scattering patterns OPs in an area of a predetermined region within the light blocking layer where the scattering patterns OPs may be disposed.

Hereinafter, scattering characteristics between comparative examples and examples will be compared and described with reference to FIG. 27 to FIG. 30 based on such a width, a depth, and a pattern area ratio.

First, in FIG. 27, scattering characteristics are described while changing a depth of the scattering patterns OPs.

FIG. 27 compares the scattering characteristics of a comparative example (Scattering patterns Non-exist) and three examples having different depths.

In FIG. 27, a refractive index difference (refractive index $\Delta n$) between the upper insulating layer UL-Ir and the scattering layer SL filling the scattering patterns OPs is the same as 0.3, the pattern area ratio is all the same at 57%, and the width of the scattering patterns OPs is all the same at 3.4 μm. In this case, the three examples of FIG. 27 have different depths of 0.1 μm, 0.2 μm, and 0.3 μm, respectively.

Comparing a scattering effect and pattern scattering images in FIG. 27, as the depth of the scattering patterns OPs increases, the scattering effect increases, and thus a halo that is visible around the display area is not visible.

Based on FIG. 27, since the example in which the halo is not visible in the scattering image is an example in which the width is 3.4 μm and the depth is 0.2 μm, based on this, when a ratio of the depth to the width of the scattering patterns OPs is calculated, it can be seen that it has a value that is greater than 0.2÷3.4, i.e., 0.058. Since the ratio of the depth to the width is not a value at which the halo is not visible, it is not a minimum value of the ratio of the depth to the width of the scattering patterns OPs. In FIG. 27, in comparing the example having a depth of 0.1 μm and the example having a depth of 0.2 μm, it can be seen that when the ratio of the depth to the width of the scattering patterns OPs is 0.05 or more, the halo might not be visible. An upper limit of the ratio of depth to width, or the maximum value of depth may be obtained when a thickness of the scattering layer SL and the depth of the scattering patterns OPs are the same, for example, when the scattering patterns OPs extend through the scattering layer SL. The upper limit of the depth to the width, which is a case where the scattering patterns OPs extend through the scattering layer SL, may vary according to the thickness of the scattering layer SL, so a separate upper limit value is not provided.

In FIG. 28, scattering characteristics will be described while changing the pattern area ratio.

FIG. 28 compares the scattering characteristics in three examples with different pattern area ratios.

In FIG. 28, a refractive index difference (refractive index $\Delta n$) between the upper insulating layer UL-Ir and the scattering layer SL filling the scattering patterns OPs is the same as 0.3, and the width and depth are 3.4 μm and 0.3 μm, respectively. Instead, the pattern area ratios are different from each other, and the scattering characteristics of the examples in which the pattern area ratios are set to 36%, 57%, and 78%, respectively, are shown.

Comparing a scattering effect and pattern scattering images of FIG. 28, as the pattern area ratio increases, the scattering effect increases, so that a halo that is visible around the display area is not recognized.

Based on FIG. 28, the pattern area ratio of the scattering patterns OPs may have a value of 30% or more and less than 100%.

In FIG. 29, the scattering characteristics will be described while changing a refractive index difference Δn.

In FIG. 29, the width and depth of the scattering patterns OPs are 3.4 μm and 0.3 μm, respectively, and the pattern area ratio is 78%. In FIG. 29, scattering characteristics of the embodiment in which a refractive index difference (refractive index Δn) between the upper insulating layer UL-Ir and the scattering layer SL filling the scattering patterns OPs are set to 0.1, 0.2, and 0.3, respectively, are illustrated.

Comparing a scattering effect and pattern scattering images in FIG. 29, as the refractive index difference Δn increases, the scattering effect increases, so that the halo that is visible around the display area is not visually recognized.

Based on FIG. 29, the refractive index difference (Δn) has a value of 0.05 or more, and the larger the refractive index difference, the better. However, since the refractive index is a characteristic based on a characteristic of a material used, a difference (Δn) of the refractive index might not have an infinitely large value. Since various differences in refractive indices may occur according to an embodiment, an upper limit value of the difference (Δn) in refractive indices is not separately limited.

FIG. 30 compares embodiments in which the refractive index difference (Δn) is also changed while changing the depth of the scattering patterns OPs.

In FIG. 30, the pattern area ratio is 78%, and the scattering patterns OPs have a same width of 3.4 μm. In this case, in some embodiments, the scattering patterns OPs are formed with a depth of 0.3 μm or 0.5 μm, and in some examples, the scattering characteristics of the examples in which the refractive index difference (refractive index Δn) is set to 0.1, 0.2, and 0.3, respectively, are illustrated.

Comparing a scattering effect and pattern scattering images in FIG. 30, the scattering effect is good when the refractive index difference (refractive index Δn) is increased, and the scattering effect is good when the depth of the scattering patterns OPs is deep. However, in the example illustrated at a rightmost side of the examples of FIG. 30, the depth of the scattering patterns OPs is 0.5 μm, but it is deep, but it can be seen that the refractive index difference (refractive index Δn) is not as large as 0.1, and only a moderate scattering effect occurs.

As illustrated in FIG. 30, a degree of scattering effect may be checked while changing a factor of 2 or more, and thus, the scattering layer may have following characteristics: The ratio of the depth to the width of the scattering patterns OPs has a value that is greater than 0.05, the pattern area ratio of the scattering patterns OPs has a value of 30% or more and less than 100%, and a difference (Δn) in refractive indices of two materials disposed at opposite sides of the scattering patterns OPs may have a value of 0.05 or more.

In FIG. 16 to FIG. 30, an example in which the scattering patterns OPs are formed over the entire area of the opening OPT of the light blocking layer has been mainly described. However, according to an embodiment, the scattering patterns OPs may be disposed exclusively in a certain area within the opening OPT of the light blocking layer, and thus one of these embodiments will be described with reference to FIG. 31.

Figure 31:
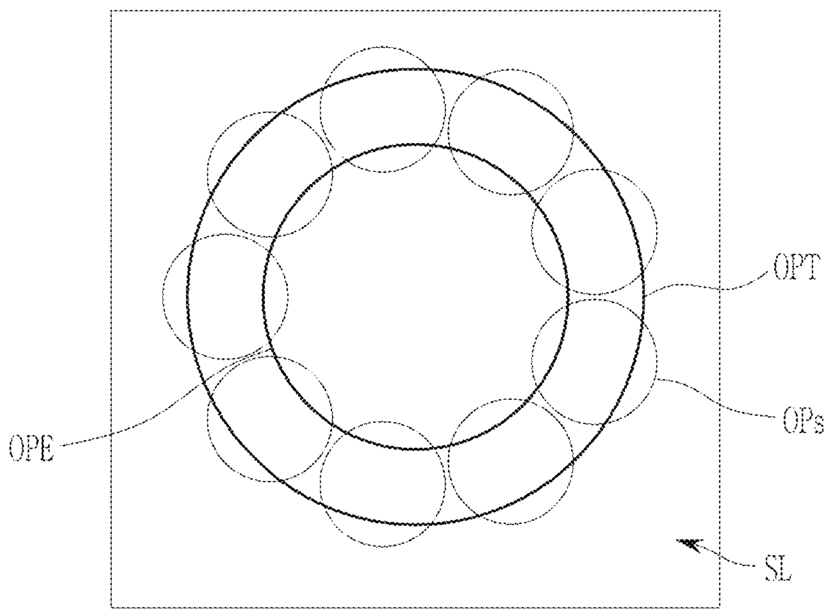
FIG. 31 is a diagram illustrating a planar structure of a scattering pattern according to an embodiment.

FIG. 31 conceptually illustrates a planar structure of a scattering pattern according to an embodiment.

FIG. 31 illustrates the opening OPT of the light blocking layer and the opening OPE of the pixel defining layer. The scattering patterns OPs included in the scattering layer SL are disposed inside the opening OPT of the light blocking layer and outside the opening OPT of the pixel defining layer in a plan view, for example, the scattering patterns OPs are arranged along the pixel defining layer exposed by the opening OPT of the light blocking layer in a plan view. Herein, some areas of the scattering patterns OPs are disposed outside the pixel defining layer exposed by the opening OPT of the light blocking layer, for example, may also be disposed inside the opening OPE of the pixel defining layer or outside the opening OPT of the light blocking layer.

In the embodiment of FIG. 31, the pattern area ratio may be defined as an area ratio occupied by the scattering patterns OPs in an area of a certain region within the light blocking layer where the scattering patterns OPs may be disposed. Herein, a predetermined area in which the scattering patterns OPs may be disposed is disposed at an inner side of the opening OPT of the light blocking layer and an outer area of the opening OPE of the pixel defining layer in a plan view, and may correspond to an area of the pixel defining layer exposed by the opening OPT of the light blocking layer in a plan view.

Even in the embodiment of FIG. 31, as in FIG. 27 to FIG. 30, the ratio of the depth to the width of the scattering patterns OPs has a value that is greater than 0.05, the pattern area ratio of the scattering patterns OPs has a value of 30% or more and less than 100%, and a difference (Δn) in refractive indices of two materials disposed at opposite sides of one side of the scattering patterns OPs as a boundary may have a value of 0.05 or more.

In the above, examples including scattering particles SP as in the examples of FIG. 5 to FIG. 15 and examples including scattering patterns OPs as in the examples of FIGS. 16 to 31 have been described.

Hereinafter, characteristics of the example including the scattering particles SP and the example including the scattering patterns OPs will be compared and described with reference to FIG. 32.

FIG. 32 illustrates a table comparing characteristics of an embodiment including scattering particles and an embodiment including scattering patterns.

FIG. 32 illustrates front luminance and 45-degree side luminance of a comparative example (Scattering particles/scattering patterns Non-exist), an example including scattering patterns, and an example including scattering particles.

Referring to FIG. 32, it can be seen that the example including the scattering patterns has a higher front luminance ratio than that of the example including the scattering particles, but a lower side luminance ratio. Accordingly, when an electronic device using a light emitting display device has important front luminance, an emissive display device including the scattering patterns is used, and when side luminance is important, an emissive display device including the scattering particles may be used.

Although the schematic cross-sectional structure has been described above, an overall cross-sectional structure according to an embodiment will be described below with reference to FIG. 33.

Figure 33:
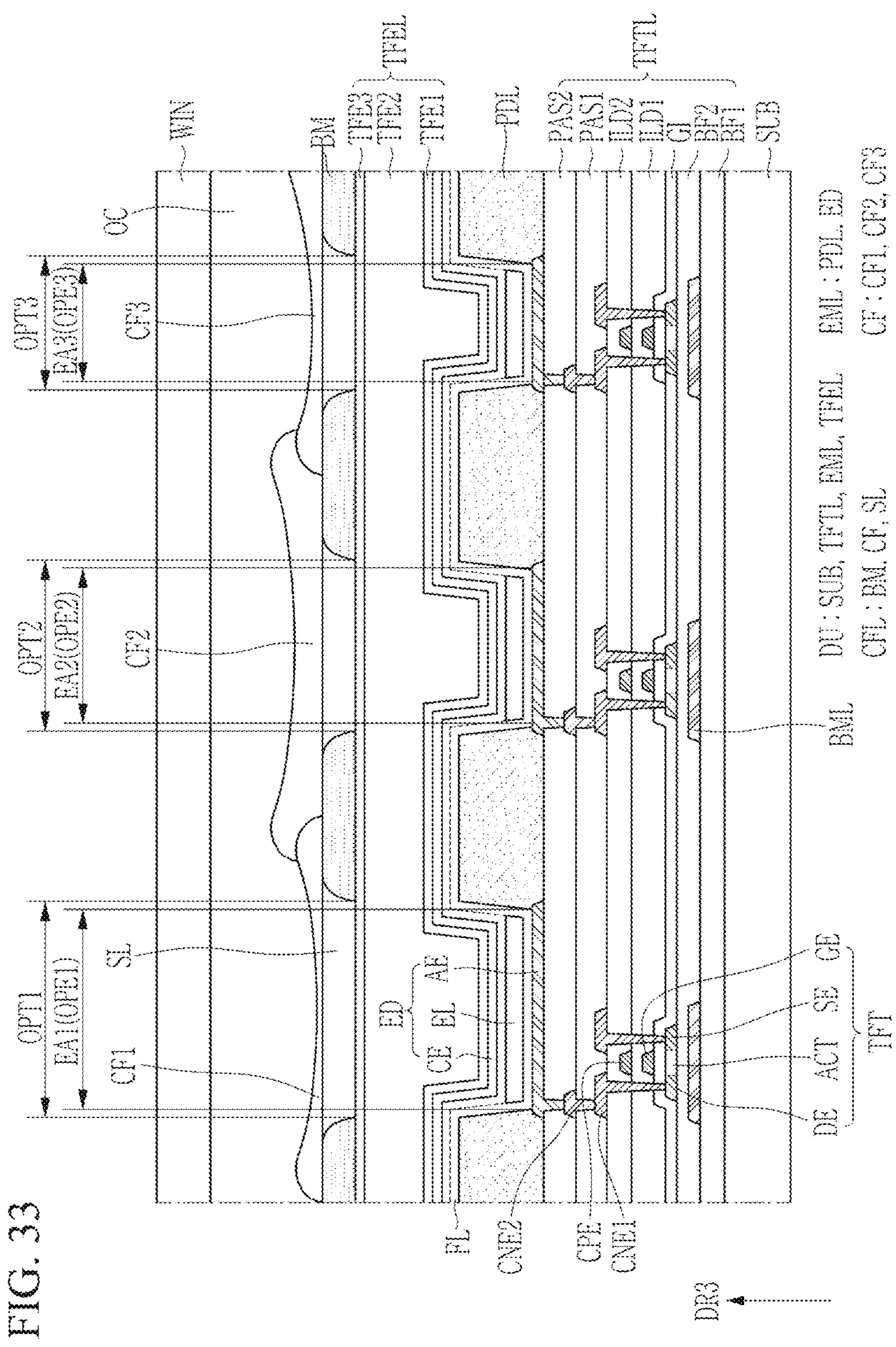
FIG. 33 is a cross-sectional structure of an emissive display device according to an embodiment.

FIG. 33 illustrates an overall cross-sectional structure of an emissive display device according to an embodiment.

FIG. 33 illustrates a cross-section crossing the first emission area EA1, the second emission area EA2, and the third emission area EA3.

The display panel 100 of the emissive display device 10 may include a display layer DU and an external light reducing layer CFL. The display layer DU may include a substrate SUB, a driving element layer TFTL, a light emitting element layer EML, and an encapsulation layer TFEL. In the display panel 100, the external light reducing layer CFL disposed on the encapsulation layer TFEL includes a light blocking layer BM, the color filters CF1, CF2, and CF3 are disposed on the light blocking layer BM, and the scattering layer SL may be disposed in the openings OPT1, OPT2, and OPT3 of the light blocking layer BM. The scattering particles or the scattering patterns may be disposed in the scattering layer SL. Unlike in FIG. 33, various modifications may be applied to the scattering layer SL.

The substrate SUB may be a base substrate or a base member. The substrate SUB may be a flexible substrate capable of being bent, folded, or rolled. For example, the substrate SUB may include a polymer resin such as polyimide (PI), but the present invention is not necessarily limited thereto. For example, the substrate SUB may include a glass material or a metal material.

The driving element layer TFTL may include a first buffer layer BF1, a lower metal layer BML, a second buffer layer BF2, a transistor TFT, a gate insulating layer GI, a first interlayer insulating layer ILD1, a capacitor electrode CPE, a second interlayer insulating layer ILD2, a first connecting electrode CNE1, a first passivation layer PAS1, a second connecting electrode CNE2, and a second passivation layer PAS2.

The first buffer layer BF1 may be disposed on the substrate SUB. The first buffer layer BF1 may include an inorganic layer capable of preventing penetration of air or moisture. For example, the first buffer layer BF1 may include a plurality of inorganic layers that are alternately stacked. According to an embodiment, the first buffer layer BF1 may be omitted.

The lower metal layer BML may be disposed on the first buffer layer BF1. For example, the lower metal layer BML may be formed as a single layer or multiple layers made of molybdenum (Mo), aluminum (Al), chromium (Cr), gold (Au), titanium (Ti), nickel (Ni), neodymium (Nd), and/or copper (Cu), or an alloy thereof.

The second buffer layer BF2 may cover the first buffer layer BF1 and the lower metal layer BML. The second buffer layer BF2 may include an inorganic layer capable of preventing penetration of air or moisture. For example, the second buffer layer BF2 may include a plurality of inorganic layers that are alternately stacked.

The transistor TFT may be disposed on the second buffer layer BF2, and the transistor TFT may be a driving transistor or a switching transistor of the pixel circuit unit. The transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in a thickness direction, and may be insulated from the gate electrode GE by the gate insulating layer GI. In a portion of the semiconductor layer ACT, a material of the semiconductor layer ACT may be conductive to form the source electrode SE and the drain electrode DE. The semiconductor layer ACT may be disposed between the source electrode SE and the drain electrode DE, and may include an undoped channel layer.

The gate electrode GE may be disposed on the gate insulating layer GI. The gate electrode GE may overlap the semiconductor layer ACT with the gate insulating layer GI disposed therebetween.

The gate insulating layer GI may be disposed on the semiconductor layer ACT. For example, the gate insulating layer GI may cover the semiconductor layer ACT and the second buffer layer BF2, and may insulate the semiconductor layer ACT from the gate electrode GE. The gate insulating layer GI may include a contact hole through which the first connection electrode CNE1 extends.

The first interlayer insulating layer ILD1 may cover the gate electrode GE and the gate insulating layer GI. The first interlayer insulating layer ILD1 may include a contact hole through which the first connection electrode CNE1 extends. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in a thickness direction. The capacitor electrode CPE and the gate electrode GE may generate a desired capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 extends. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the transistor TFT and the second connecting electrode CNE2. The first connecting electrode CNE1 may be inserted into contact holes formed in the second interlayer insulating layer ILD2, the first interlayer insulating layer ILD1, and the gate insulating layer GI to contact the drain electrode DE of the transistor TFT.

The first passivation layer PAS1 may cover the first connecting electrode CNE1 and the second interlayer insulating layer ILD2. The first passivation layer PAS1 may protect the transistor TFT. The first passivation layer PAS1 may include a contact hole through which the second connecting electrode CNE2 extends.

The second connecting electrode CNE2 may be disposed on the first passivation layer PAS1. The second connecting electrode CNE2 may electrically connect the first connecting electrode CNE1 and a pixel electrode AE (hereinafter, also referred to as an anode or a first electrode) of the light emitting diode ED. The second connecting electrode CNE2 may be inserted into a contact hole formed in the first passivation layer PAS1 to make contact with the first connecting electrode CNE1.

The second passivation layer PAS2 may cover the second connecting electrode CNE2 and the first passivation layer PAS1. The second passivation layer PAS2 may include a contact hole through which the pixel electrode AE of the light emitting diode ED extends.

The light emitting element layer EML may be disposed on the driving element layer TFTL. The light emitting element layer EML may include a light emitting diode ED and a pixel defining layer PDL. The light emitting diode ED may include a pixel electrode AE, an emission layer EL, and a common electrode CE (hereinafter referred to as a second electrode or cathode). The light emitting diode ED may additionally include a hole injection layer, a hole transport layer, an electron injection layer, and/or an electron transport layer, and may further include functional layers FL disposed at opposite sides of the emission layer EL.

The pixel electrode AE may be disposed on the second passivation layer PAS2. The pixel electrode AE may overlap one of the openings OPE1, OPE2, and OPE3 of the pixel defining layer PDL. The pixel electrode AE may be electrically connected to the drain electrode DE of the transistor TFT through the first and second connecting electrodes CNE1 and CNE2.

The emission layer EL may be disposed on the pixel electrode AE. For example, the emission layer EL may be an organic light emitting layer made of an organic material, but the present invention is not necessarily limited thereto. A functional layer FL may be disposed at opposite sides of the emission layer EL, the functional layer FL disposed between the emission layer EL and the pixel electrode AE may include a hole injection layer and/or a hole transport layer, and the functional layer FL disposed between the emission layer EL and the common electrode CE may include an electron transport layer and/or an electron injection layer. When the emission layer EL corresponds to an organic light emitting layer, when the transistor TFT applies a predetermined voltage to the pixel electrode AE of the light emitting diode ED and the common electrode CE of the light emitting diode ED receives a common voltage or a driving low voltage, holes and electrons respectively move to the emission layer EL through the hole transport layer and the electron transport layer, and a current flows through the light emitting diode ED, and holes and electrons may be combined with each other in the emission layer EL to emit light.

The common electrode CE may be disposed on the emission layer EL. For example, the common electrode CE may be implemented in the form of an electrode common to all pixels, not differentiated by a plurality of pixels. The common electrode CE may be disposed on the emission layer EL in the first to third emission areas EA1, EA2, and EA3, and may be disposed on the pixel defining layer PDL in areas other than the first to third emission areas EA1, EA2, and EA3. The functional layer FL may be disposed between the pixel defining layer PDL and the common electrode CE.

The common electrode CE may receive a common voltage or a driving low voltage. When the pixel electrode AE receives a voltage corresponding to the data voltage and the common electrode CE receives the driving low voltage, a potential difference is formed between the pixel electrode AE and the common electrode CE, and the emission layer EL emits light as a current flows.

The pixel defining layer PDL may include a plurality of openings OPE1, OPE2, and OPE3 disposed on portions of the second passivation layer PAS2 and the pixel electrode AE. The pixel defining layer PDL may include a first opening OPE1, a second opening OPE2, and a third opening OPE3, and each of the openings OPE1, OPE2, and OPE3 may expose a portion of the pixel electrode AE. As described above, each of the openings OPE1, OPE2, and OPE3 of the pixel defining layer PDL may define the first to third emission areas EA1, EA2, and EA3, and their areas or sizes may be different from each other. The pixel defining layer PDL may separate and insulate the pixel electrode AE of each of a plurality of light emitting diodes ED. The pixel defining layer PDL may be a black pixel defining layer including a light absorbing material to prevent reflection of external light. For example, the pixel defining layer PDL may include a polyimide (PI)-based binder and pigments in which red, green, and blue colors are mixed. Alternatively, the pixel defining layer PDL may include a cardo-based binder resin and a mixture of a lactam black pigment and a blue pigment. Alternatively, the pixel defining layer PDL may include a carbon black.

The encapsulation layer TFEL may be disposed on the common electrode CE and may cover the light emitting diodes ED. The encapsulation layer TFEL may include at least one inorganic layer, to prevent oxygen or moisture from penetrating into the light emitting element layer EML. The encapsulation layer TFEL may include at least one organic film to protect the light emitting element layer EML from foreign particles such as dust.

The encapsulation layer TFEL in FIG. 33 may include a first encapsulation layer TFE1, a second encapsulation layer TFE2, and a third encapsulation layer TFE3. The first encapsulation layer TFE1 and the third encapsulation layer TFE3 may be inorganic encapsulation layers, and the second encapsulation layer TFE2 disposed therebetween may be an organic encapsulation layer.

The first encapsulation layer TFE1 and the third encapsulation layer TFE3 may each include at least one inorganic insulator. The inorganic insulator may include an aluminum oxide, a titanium oxide, a tantalum oxide, a hafnium oxide, a zinc oxide, a silicon oxide, a silicon nitride, and/or a silicon oxynitride.

The second encapsulation layer TFE2 may include a polymer-based material. The polymer-based material may include an acrylic resin, an epoxy resin, polyimide, and polyethylene. For example, the second encapsulation layer TFE2 may include an acrylic resin, e.g., polymethyl methacrylate or polyacrylic acid. The second encapsulation layer TFE2 may be formed by curing a monomer or applying a polymer.

The external light reducing layer CFL disposed on the encapsulation layer TFEL includes a light blocking layer BM and color filters CF1, CF2, and CF3. The color filters CF1, CF2, and CF3 may be disposed on the light blocking layer BM, and the scattering layer SL may be disposed within the openings OPT1, OPT2, and OPT3 of the light blocking layer BM.

The light blocking layer BM may be disposed on the encapsulation layer TFEL. The light blocking layer BM may include a plurality of openings OPT1, OPT2, and OPT3 overlap the emission areas EA1, EA2, and EA3. The first opening OPT1 may overlap the first emission area EA1 or the first opening OPE1. The second opening OPT2 may overlap the second light emitting area EA2 or the second opening OPE2, and the third opening OPT3 may overlap the third emission area EA3 or the third opening OPE3. An area or size of each of the openings OPT1, OPT2, and OPT3 may be larger than that of the openings OPE1, OPE2, and OPE3 of the pixel defining layer PDL. As the openings OPT1, OPT2, and OPT3 of the light blocking layer BM are larger than the openings OPE1, OPE2, and OPE3 of the pixel defining layer PDL, light emitted from the emission areas EA1, EA2, and EA3 may be viewed by a user, not only from a front surface, but also from a side surface of the emissive display device 10.

The light blocking layer BM may include a light absorbing material. For example, the light blocking layer BM may include an inorganic black pigment or an organic black pigment. The inorganic black pigment may be carbon black, and the organic black pigment may include lactam black, perylene black, and/or aniline black, but the present invention is not necessarily limited thereto. The light blocking layer BM may help color reproducibility of the emissive display device 10 by preventing visible light from penetrating between the first to third light emitting regions EA1, EA2, and EA3 and mixing colors.

The scattering layer SL may be disposed in the openings OPT1, OPT2, and OPT3 of the light blocking layer BM. The scattering layer SL may include scattering particles or may include scattering patterns.

The color filters CF1, CF2, and CF3 of the external light reducing layer CFL may be disposed on the light blocking layer BM. The different color filters CF1, CF2, and CF3 may be respectively disposed to correspond to the different emission areas EA1, EA2, and EA3, the openings OPE1, OPE2, and OPE3 of the pixel defining layer PDL and the openings OPT1, OPT2, and OPT3 of the light blocking layer BM. For example, the first color filter CF1 may correspond to the first emission area EA1, the second color filter CF2 may correspond to the second emission area EA2, and the third color filter CF3 may correspond to the third emission area EA3. The first color filter CF1 may be disposed in the first opening OPT1 of the light blocking layer BM, the second color filter CF2 is disposed in the second opening OPT2 of the light blocking layer BM, and the third color filter CF3 may be disposed in the third opening OPT3 of the light blocking layer BM. Each of the color filters CF1, CF2, and CF3 may have a larger area in a plan view than the openings OPT1, OPT2, and OPT3 of the light blocking layer BM, and some may be directly disposed on the light blocking layer BM. An overlapping portion where adjacent color filters CF1, CF2, and CF3 at least partially overlap may be disposed on the light blocking layer BM.

The external light reducing layer CFL may further include a planarization layer OC disposed on the color filters CF1, CF2, and CF3, and the planarization layer OC may be disposed on the color filters CF1 and CF2 to planarize upper ends of the color filters CF1 and CF2. The planarization layer OC may be a colorless light-transmitting layer that does not have a color in a visible light range. For example, the planarization layer OC may include a colorless light-transmitting organic material such as an acryl-based resin.

A touch sensing unit for sensing a touch may be disposed between the encapsulation layer TFEL and the external light reduction layer CFL. Herein, the touch sensing unit may include a sensing electrode at least partially overlapping the light blocking layer BM in a plan view, and a sensing insulating layer disposed on at least one side of the sensing electrode. Herein, the sensing electrode may be electrically connected to the touch driver 400 of FIG. 2. The touch driver 400 may supply a touch driving signal to sensing electrodes, and may sense a change in capacitance between the sensing electrodes.

According to an embodiment, a touch sensing unit for sensing a touch may be included in a cover window (refer to WIN in FIG. 1) disposed on the planarization layer OC.

In the embodiment of FIG. 33, the polarizer is not shown because the polarizer might not be displayed on a front surface of the emissive display device and an electronic device including the same, for example, at an upper side in the third direction DR3. For example, an emissive display device that does not include a polarizer may have problems due to reflection of external light, and in the present disclosure, the light blocking layer BM and color filters CF1, CF2, and CF3 may be formed above an emission area, a pixel defining layer PDL may include a black material, the scattering layer SL may be formed, thereby removing deterioration in display quality due to reflection of external light.

While this disclosure has been described in connection with what is presently considered to be practical embodiments, it is to be understood that the invention is not necessarily limited to the disclosed embodiments, but is intended to cover various modifications and equivalent arrangements included within the spirit and scope of the present disclosure.

What is claimed is:

1. An emissive display device, comprising:
a substrate;
a first electrode disposed on the substrate;
a pixel defining layer having a first opening exposing the first electrode;
a second electrode disposed on both the pixel defining layer and the first electrode;
an encapsulation layer at least partially covering the second electrode;
a light blocking layer disposed on the encapsulation layer and having a second opening;
a color filter disposed on the light blocking layer; and
a scattering layer disposed within the second opening of the light blocking layer and including a plurality of scattering particles,
wherein particle density of the scattering particles has a value of 1 ea/mm$^3$ or more and 10 ea/mm$^3$ or less, and a diameter of the scattering particles is 0.1 μm or more and 1.5 μm or less.

2. The emissive display device of claim 1, wherein
the scattering particles include a titanium oxide.

3. The emissive display device of claim 2, wherein
the scattering layer has a thickness of 1 μm or more and 3 μm or less.

4. The emissive display device of claim 3, wherein
particle density of the titanium oxide has a value of 3 ea/mm$^3$ or more and 8 ea/mm$^3$ or less, and a diameter of the titanium oxide is 0.2 μm or more and 0.6 μm or less.

5. An emissive display device comprising:
a substrate;
a first electrode disposed on the substrate;
a pixel defining layer having a first opening exposing the first electrode;
a second electrode disposed on both the pixel defining layer and the first electrode;
an encapsulation layer at least partially covering the second electrode;
a light blocking layer disposed on the encapsulation layer and having a second opening;
a color filter disposed on the light blocking layer; and
a scattering layer disposed within the second opening of the light blocking layer and including a plurality of scattering particles,
wherein particle density of the scattering particles has a value of 2 ea/mm$^3$ or more and 20 ea/mm$^3$ or less, and a diameter of the scattering particles is 0.1 μm or more and 1.5 μm or less.

6. The emissive display device of claim 5, wherein
the scattering particles include a zirconium oxide, an aluminum oxide, a silicon oxide, and/or hollow silica.

7. The emissive display device of claim 6, wherein
the hollow silica has a structure in which a three-dimensional silicon oxide particle contains an empty space.

8. The emissive display device of claim 7, wherein
particle density of the hollow silica has a value of 3 ea/mm$^3$ or more and 8 ea/mm$^3$ or less, a diameter of the hollow silica is 0.2 μm or more and 0.6 μm or less, and a thickness of the scattering layer including the hollow silica is 1 μm or more and 3 μm or less.

9. An emissive display device, comprising:

a substrate;

a first electrode disposed on the substrate;

a pixel defining layer having a first opening exposing the first electrode;

a second electrode disposed on both the pixel defining layer and the first electrode;

an encapsulation layer at least partially covering the second electrode;

a light blocking layer disposed on the encapsulation layer and having a second opening;

a color filter disposed on the light blocking layer; and a scattering layer disposed within the second opening of the light blocking layer and including a plurality of scattering particles, wherein particle density of the scattering particles has a value of 3 $ea/mm^3$ or more and 30 $ea/mm^3$ or less, and a diameter of the scattering particles is 0.2 μm or more and 5.0 μm or less.

10. The emissive display device of claim 9, wherein the scattering particles include an acrylate-based material and/or a silicon-based material.

11. An emissive display device, comprising:

a substrate;

a first electrode disposed on the substrate;

a pixel defining layer having a first opening exposing the first electrode;

a second electrode disposed on both the pixel defining layer and the first electrode;

an encapsulation layer at least partially covering the second electrode;

a light blocking layer disposed on the encapsulation layer and having a second opening;

a color filter disposed on the light blocking layer; and a scattering layer including a plurality of scattering patterns at least partially overlapping the second opening of the light blocking layer, wherein a pattern area ratio of the scattering patterns has a value of 30% or more and less than 100%.

12. The emissive display device of claim 11, wherein a ratio of a depth to a width of the scattering patterns has a value of 0.05 or more, and a maximum value of the depth of the scattering patterns is obtained when the scattering patterns extend through the scattering layer.

13. The emissive display device of claim 12, wherein a difference between the refractive indices of two materials disposed at opposite sides of one side of the scattering patterns as a boundary has a value of 0.05 or more.

14. The emissive display device of claim 13, wherein at least two scattering patterns among the scattering patterns have different diameters.

15. The emissive display device of claim 13, wherein the color filter is disposed within the scattering patterns.

16. The emissive display device of claim 13, further comprising a transparent organic portion disposed in the second opening of the light blocking layer, wherein the transparent organic portion is disposed within the scattering patterns.

17. The emissive display device of claim 13, wherein the encapsulation layer sequentially includes a first encapsulation layer, a second encapsulation layer, and a third encapsulation layer, the first encapsulation layer and the third encapsulation layer are inorganic encapsulation layers, the second encapsulation layer is an organic encapsulation layer, and the uppermost third encapsulation layer and the scattering layer are a single integral structure, and the scattering patterns are disposed in the third encapsulation layer.

18. The emissive display device of claim 13, wherein the scattering layer is disposed within the second opening of the light blocking layer.

19. The emissive display device of claim 13, wherein the scattering layer and the scattering patterns are formed through a phase separation process.

20. The emissive display device of claim 13, wherein the scattering patterns are arranged along the pixel defining layer exposed by the second opening of the light blocking layer.

* * * * *